(12) United States Patent
Zhong et al.

(10) Patent No.: US 9,063,874 B2
(45) Date of Patent: Jun. 23, 2015

(54) APPARATUS, SYSTEM, AND METHOD FOR WEAR MANAGEMENT

(71) Applicant: Fusion-io, Inc., Salt Lake City, UT (US)

(72) Inventors: Hao Zhong, San Jose, CA (US); Ned D. Plasson, Salt Lake City, UT (US); Robert Wood, Niwot, CO (US); Jea Woong Hyun, South Jordan, UT (US); Hairong Sun, Superior, CO (US)

(73) Assignee: SanDisk Technologies, Inc., Plano, TX (US)

( * ) Notice: Subject to any disclaimer, the term of this patent is extended or adjusted under 35 U.S.C. 154(b) by 155 days.

(21) Appl. No.: 13/844,338

(22) Filed: Mar. 15, 2013

(65) Prior Publication Data
US 2013/0232289 A1 Sep. 5, 2013

Related U.S. Application Data

(63) Continuation-in-part of application No. 12/616,124, filed on Nov. 10, 2009, now Pat. No. 8,516,343, and a continuation-in-part of application No. 13/724,812, filed on Dec. 21, 2012.

(60) Provisional application No. 61/112,955, filed on Nov. 10, 2008, provisional application No. 61/652,745, filed on May 29, 2012.

(51) Int. Cl.
G06F 11/00 (2006.01)
G06F 11/10 (2006.01)
(Continued)

(52) U.S. Cl.
CPC ........ *G06F 11/1008* (2013.01); *G06F 12/0246* (2013.01); *G06F 2211/109* (2013.01);
(Continued)

(58) Field of Classification Search
CPC ............ G06F 11/1008; G06F 12/0246; G11C 16/349; G11C 16/3495
USPC .......................... 714/42, 47.1, 47.2; 711/103
See application file for complete search history.

(56) References Cited

U.S. PATENT DOCUMENTS 5,715,193 A 2/1998 Norman
5,831,989 A 11/1998 Fujisaki
(Continued)

FOREIGN PATENT DOCUMENTS

WO 2010054410 5/2010

OTHER PUBLICATIONS

Asine Group, ASPMC_660, http://www.asinegroup.com/products/aspmc660.html, sopyright 2002, downloaded on Nov. 18, 2009.
(Continued)

Primary Examiner — Joseph Kudirka

(57) ABSTRACT

A storage module is configured to determine a health metric of a storage division of a solid-state storage medium. The health metric may comprise a combination of factors, including, but not limited to: wear level, performance (e.g., program time, erase time, and the like), error rate, and the like. A wear level module may configure storage operations to reduce the wear rate of storage divisions having poor health metrics and/or heath metrics that are degrading more quickly than other storage divisions. Reducing wear rate may include deferring grooming operations, delaying use for storage operations, temporarily retiring the storage division, or the like. Storage divisions may be brought back into service at normal use rates in response determining that other portions of the storage media have been worn to the point that they exhibit similar health and/or reliability characteristics.

21 Claims, 9 Drawing Sheets

(51) Int. Cl.

| | | |
|---|---|---|
| *G06F 12/02* | (2006.01) | |
| *G06F 11/14* | (2006.01) | |
| *G11C 29/00* | (2006.01) | |
| *G11C 16/04* | (2006.01) | |
| *G11C 16/34* | (2006.01) | |
| *G11C 29/42* | (2006.01) | |
| *G11C 29/04* | (2006.01) | |
| *G11C 29/12* | (2006.01) | |
| *G06F 11/30* | (2006.01) | |

(52) U.S. Cl.
CPC ............. *G06F11/108* (2013.01); *G06F 11/141* (2013.01); *G11C 29/832* (2013.01); *G11C 29/88* (2013.01); *G11C 16/04* (2013.01); *G11C 16/3418* (2013.01); *G11C 16/3422* (2013.01); *G11C 16/349* (2013.01); *G11C 29/42* (2013.01); *G11C 29/82* (2013.01); *G11C 2029/0411* (2013.01); *G11C 2029/1208* (2013.01); *G06F 11/3034* (2013.01); *G06F 11/3055* (2013.01); *G11C 16/3495* (2013.01)

(56) References Cited

U.S. PATENT DOCUMENTS

| | | | |
|---|---|---|---|
| 5,854,796 A | 12/1998 | Sato | |
| 6,014,755 A | 1/2000 | Wells et al. | |
| 6,034,831 A | 3/2000 | Dobbek et al. | |
| 6,188,619 B1 | 2/2001 | Jung | |
| 6,684,349 B2 | 1/2004 | Gullo et al. | |
| 6,725,321 B1 | 4/2004 | Sinclair et al. | |
| 7,035,967 B2 * | 4/2006 | Chang et al. | 711/103 |
| 7,272,755 B2 | 9/2007 | Smith | |
| 7,349,254 B2 | 3/2008 | Prasad | |
| 7,623,365 B2 | 11/2009 | Jeddeloh | |
| 7,765,426 B2 | 7/2010 | Li | |
| 7,864,579 B2 * | 1/2011 | Gutsche et al. | 365/185.09 |
| 8,001,318 B1 * | 8/2011 | Iyer et al. | 711/103 |
| 8,051,241 B2 * | 11/2011 | Feldman et al. | 711/103 |
| 8,176,367 B2 | 5/2012 | Dreifus et al. | |
| 8,195,978 B2 | 6/2012 | Flynn et al. | |
| 8,341,335 B2 | 12/2012 | Weingarten et al. | |
| 8,516,343 B2 | 8/2013 | Flynn et al. | |
| 8,601,313 B1 | 12/2013 | Horn | |
| 8,612,669 B1 | 12/2013 | Syu et al. | |
| 8,806,106 B2 * | 8/2014 | Goss et al. | 711/103 |
| 8,806,111 B2 | 8/2014 | Whitney | |
| 8,819,498 B2 | 8/2014 | Gearing et al. | |
| 2001/0052093 A1 | 12/2001 | Oshima et al. | |
| 2002/0108016 A1 | 8/2002 | Haines et al. | |
| 2003/0204788 A1 | 10/2003 | Smith | |
| 2004/0073829 A1 | 4/2004 | Olarig | |
| 2005/0005191 A1 | 1/2005 | Judd | |
| 2005/0091452 A1 | 4/2005 | Chen et al. | |
| 2005/0204187 A1 * | 9/2005 | Lee et al. | 714/8 |
| 2006/0085670 A1 | 4/2006 | Carver et al. | |
| 2007/0006048 A1 | 1/2007 | Zimmer et al. | |
| 2007/0106870 A1 | 5/2007 | Bonwick et al. | |
| 2007/0118713 A1 | 5/2007 | Guterman et al. | |
| 2007/0150654 A1 | 6/2007 | Shin et al. | |
| 2007/0245068 A1 | 10/2007 | Yero | |
| 2007/0255889 A1 | 11/2007 | Yogev et al. | |
| 2007/0266200 A1 | 11/2007 | Gorobets et al. | |
| 2007/0266276 A1 | 11/2007 | Gatzemeier et al. | |
| 2008/0010566 A1 | 1/2008 | Chang et al. | |
| 2008/0082725 A1 * | 4/2008 | Elhamias | 711/103 |
| 2008/0120518 A1 | 5/2008 | Ritz et al. | |
| 2008/0141043 A1 | 6/2008 | Flynn et al. | |
| 2008/0244368 A1 | 10/2008 | Chin et al. | |
| 2009/0077429 A1 * | 3/2009 | Yim et al. | 714/54 |
| 2009/0089603 A1 | 4/2009 | Ding et al. | |
| 2009/0300277 A1 * | 12/2009 | Jeddeloh | 711/104 |
| 2010/0064096 A1 * | 3/2010 | Weingarten et al. | 711/103 |
| 2010/0174845 A1 * | 7/2010 | Gorobets et al. | 711/103 |
| 2010/0306580 A1 | 12/2010 | Mckean et al. | |
| 2010/0332923 A1 * | 12/2010 | D'Abreu et al. | 714/708 |
| 2011/0231730 A1 | 9/2011 | Allen | |
| 2011/0252289 A1 | 10/2011 | Patapoutian et al. | |
| 2012/0023144 A1 * | 1/2012 | Rub | 707/813 |
| 2012/0317345 A1 * | 12/2012 | Pan et al. | 711/103 |
| 2013/0007380 A1 * | 1/2013 | Seekins et al. | 711/154 |
| 2013/0145079 A1 * | 6/2013 | Lee et al. | 711/103 |
| 2013/0159603 A1 | 6/2013 | Whitney | |

OTHER PUBLICATIONS

BITMICRO, BiTMICRO Introduces E-Disk PMC Flash Module at Military & Aerospace Electronics East, May 18, 2004. BiTMICRO, http://11www.bitmicro.com/press_news_releases_20040518_prt.php.

Micron, NAND Flash 101: An Introduction to NAND Flash and How to Design It in to Your Next Product, Micron, pp. 1-28, Micron Technology Nov. 2006.

International Bureau, PCT/US2009/063938, International Search Report and Written Opinion, Jun. 23, 2010.

International Bureau, PCT/US2009/063938, International Preliminary Report on Patentability, May 19, 2011.

Samsung, "ECC Algorithm", Flash Planning Group Memory Division Samsung Electronics Co., Ltd, pp. 1-8, ecc_algorithm_for_web_512b_March_2005.pdf=http://www.samsung.com/global/business/semi-sonductor/products/flash/FlashApplicationNote.html.

STMicroelectronics, AN1819 Application Note, Bad Block Management in Single Level Cell NAND Flash Memories,: Jan. 2006, p. 1-7.

USPTO, Office Action for U.S. Appl. No. 12/616,124 mailed Apr. 27, 2012.

USPTO, Office Action for U.S. Appl. No. 12/616,124 mailed Sep. 24, 2012.

USPTO, Office Action for U.S. Appl. No. 12/616,124 mailed Feb. 25, 2013.

USPTO, Office Action for U.S. Appl. No. 13/724,812 mailed Dec. 17, 2014.

USPTO, Office Action for U.S. Appl. No. 13/724,761 mailed Mar. 26, 2015.

* cited by examiner

APPARATUS, SYSTEM, AND METHOD FOR WEAR MANAGEMENT

CROSS-REFERENCE TO RELATED APPLICATIONS

This application is a continuation-in-part of, and claims priority to, U.S. patent application Ser. No. 12/616,124, entitled, "Apparatus, System, and Method for Predicting Failures in Solid-State Storage, filed Nov. 10, 2009, for David Flynn et al., which claims priority to U.S. Provisional Patent Application No. 61/112,955, entitled, "Apparatus, System, and Method for Predicting Errors in Solid-State Storage," filed Nov. 10, 2008, for David Flynn et al., this application also claims priority to, and is a continuation-in-part of, U.S. patent application Ser. No. 13/724,812, entitled, "Apparatus, System, and Method for Managing Solid-State Storage Reliability," filed Dec. 21, 2012, for Warner Losh et al., and which claims priority to U.S. Provisional Patent Application No. 61/652,745, entitled, "Apparatus, System, and Method for Managing Storage Division Retirement," filed on May 29, 2012, each of which are hereby incorporated by reference.

TECHNICAL FIELD

This disclosure relates to apparatus, systems, and methods for managing a solid-state storage medium and, in particular, to managing wear of various portions of the solid-state storage medium.

BACKGROUND

Wear leveling a solid-state storage medium may comprise adapting storage operations to evenly distribute storage operations between different portions of the medium. However, different portions of the solid-state storage medium may wear at different rates due to, inter alia, physical characteristics of the solid-state storage medium, quality, signal path attenuation, manufacturing variations, and so on. Accordingly, the wear level alone may not be an accurate gauge of the reliability and/or remaining useful life.

SUMMARY

Disclosed herein are embodiments of a method for managing wear on a solid-state storage medium. The disclosed methods may comprise one or more machine-executable operations and/or steps. The disclosed operations and/or steps may be embodied as program code stored on a computer readable storage medium. Accordingly, embodiments of the methods disclosed herein may be embodied as a computer program product comprising a computer readable storage medium storing computer usable program code executable to perform one or more method operations and/or steps.

Embodiments of the disclosed method may comprise determining an overall reliability metric of a solid-state storage medium based on reliability metrics of a plurality of different sections of the solid-state storage medium, identifying a section of the solid-state storage medium having a reliability metric that differs from the overall reliability metric by more than a threshold, and managing storage operations performed on the solid-state storage medium to adjust wear of the identified section in response to the storage operations. Managing the storage operations may include relocating valid data from the identified section and deferring a reclamation operation on the identified section and/or identifying a storage request pertaining to cold data, and storing the cold data on the identified section.

In some embodiments, the method includes indicating that the identified section is out-of-service. The method may further comprise indicating that the identified section is in service and available for storing data in response to determining that a differential between the reliability metric of the identified section and a new overall reliability metric of the solid-state storage medium determined after performing a plurality of storage operations on the solid-state storage medium is within the threshold.

Embodiments of the method may comprise determining an updated overall reliability metric of the solid-state storage medium subsequent to identifying the section, and managing storage operations performed on the solid-state storage medium to adjust a wear rate of the identified section in response to determining that the reliability metric of the identified section is within the threshold of the updated overall reliability metric.

In some embodiments, the method includes recording indications of reduced wear sections of the solid-state storage medium, accessing the indications to schedule storage operations on the solid-state storage medium, and/or recording the indications on a non-volatile storage medium. The reliability metric may be based on one or more of a raw bit error rate of the section, a program time of the section, an erase time of the section, and a program count of the section.

Disclosed herein are embodiments of an apparatus, comprising a reliability analysis module configured to determine an aggregate health metric corresponding to respective health metrics of storage divisions of a solid-state storage medium and to identify a set of one or more storage divisions having health metrics that deviate from the aggregate health metric by more than a threshold, and a wear management module configured to adapt storage operations performed on the identified set of storage divisions to manage usage of the identified set of storage divisions.

The apparatus may further comprise a reliability monitoring module configured to determine the respective health metrics of a plurality of storage divisions of a solid-state storage device. The storage division health metrics are based on performance characteristics of the storage divisions. In some embodiments, the apparatus further includes a groomer module configured to prepare storage divisions for use by relocating valid data from the storage divisions and initializing the storage divisions. The groomer module may be configured to relocate valid data from one of the identified set of storage divisions and to delay initializing the storage division.

Embodiments of the apparatus may include a log storage module configured to queue storage divisions for data storage operations. The log storage module may be configured to remove one or more of the identified set of storage divisions from the queue. Alternatively, or in addition, the log storage module may be configured to queue one or more of the identified storage divisions in a reduced usage queue, and to schedule a storage operation on a storage division in the reduced usage queue in response to receiving a storage request pertaining to low-usage data. The log storage module may be configured to queue the storage divisions in an ordered queue, and to reorder one or more of the identified set of storage divisions to an end of the ordered queue.

The reliability analysis module may be configured to remove a storage division from the identified set of storage divisions in response to determining that a deviation between the health metric of the storage division and an updated aggregate health metric is less than the threshold.

Disclosed herein are embodiments of a system, comprising means for identifying a first set of a plurality of solid-state storage sections having reliability characteristics that differ from reliability characteristics of a second set of the plurality of solid-state storage sections by more than a threshold, means for receiving a plurality of requests to perform storage operations on the solid-state storage sections, and means for modifying a sequential storage pattern for the requested storage operations to vary usage of the first set of solid-state storage sections as compared to usage of the second set of solid-state storage sections. Embodiments of the system may further include means for determining reliability characteristics of the storage sections comprising means for monitoring one or more of error rates of the storage sections, program times of the storage sections, and erase times of the storage sections.

The disclosed system may further comprise means for determining updated reliability characteristics of the others of the solid-state storage sections, and means for selecting a storage section for removal from the first set and inclusion in the second set in response to determining that reliability characteristics of the selected storage section are within a deviation threshold of the updated reliability characteristics of the solid-state storage divisions in the second set.

Embodiments of the disclosed system may include means for grooming solid-state storage sections for reuse comprising means for delaying reuse of storage sections in the first set and/or means for queuing the storage operations on the solid-state storage sections configured to prevent storage operations from being queued to the solid-state storage sections in the first set.

DETAILED DESCRIPTION

Figure 1:
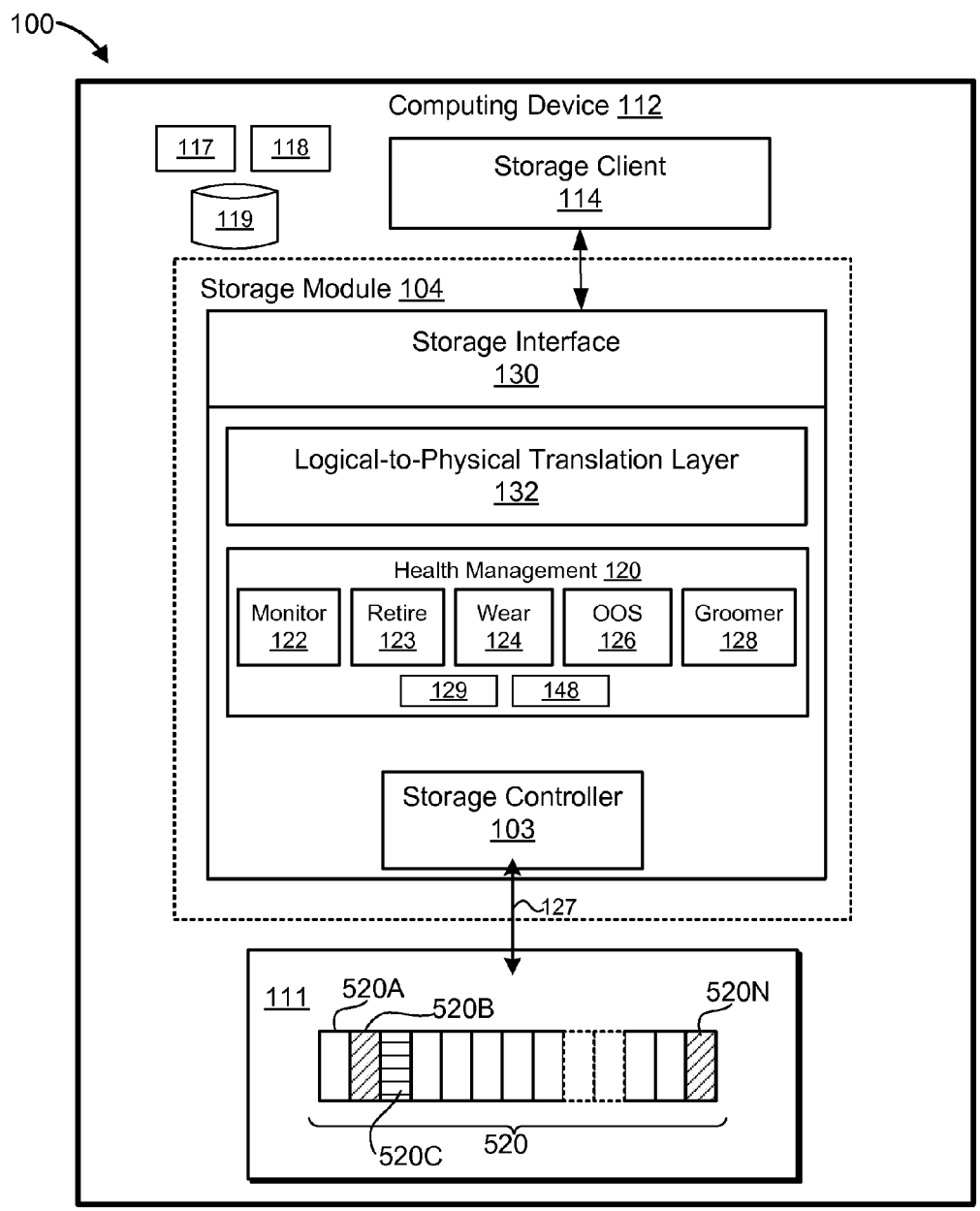
FIG. 1 is a block diagram of one embodiment of a system for wear management for solid-state storage media.

FIG. 1 is a block diagram of one embodiment of a system 100 comprising a storage module 104 configured to manage solid-state storage medium 111. The storage module 104 may comprise storage controller 103, a logical-to-physical translation layer 132, and a health management module 120.

The solid-state storage medium 111 may comprise non-volatile, solid-state storage media, such as flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), Resistive Random-Access Memory (RRAM), Programmable Metallization Cell (PMC), Conductive-Bridging RAM (CBRAM), Magneto-Resistive RAM (MRAM), Dynamic RAM (DRAM), Phase change RAM (PRAM), or the like. The storage controller 103 may be configured to write data to and/or read data from the solid-state storage medium 111 via a bus 127. The bus 127 may comprise a storage I/O bus for communicating data to/from the solid-state storage medium 111, and may further comprise a control I/O bus for communicating addressing and other command and control information to the solid-state storage medium 111.

The solid-state storage medium 111 may comprise a plurality of storage units, which may be organized and/or partitioned into respective sections 520. As used herein, a "storage unit" or "physical storage unit" refers to one or more physical storage locations on the solid-state storage medium 111. A storage unit may refer to any unit of storage including, but not limited to: a page, a group, collection, or set of pages (e.g., a logical page), a sector, a block, or the like. The storage module 104 may be configured to manage groups of storage units in various sections 520, which may be referred to as "storage divisions." As used herein, a "storage division" refers to a particular portion or section of a solid-state storage medium 111, which may include a group, collection, and/or set of storage units. Accordingly, a storage division 130 may refer to one or more of an erase block, a group, collection and/or set of erase blocks (e.g., logical erase block), or the like. As illustrated in FIG. 1, the solid-state storage medium 111 may comprise a plurality of storage sections 520A-N, each of which may exhibit different reliability and/or health characteristics.

As disclosed in further detail herein, the storage module 104 may be configured to perform storage operations on logical storage units. As used herein, a "logical storage unit" refers to a group of two or more storage units, such as a group of physical pages. The storage module 104 may be configured to perform storage operations on the two or more storage units in parallel. In some embodiments, the storage module 104 may be configured to store data structures, such as data segments, packets, ECC codewords, or the like, on two or more of the physical storage units of a logical storage unit.

The storage module 104 may comprise and/or be implemented on a computing device 112. The computing device 112 may comprise a processor 117, volatile memory 118, and/or persistent storage 119. The processor 117 may comprise one or more general and/or special purpose processing elements. The processor 117 may be configured to execute instructions loaded into the volatile memory 118 from the persistent storage 119. Portions of one or more of the modules of the storage module 104 may be embodied as machine-readable instructions stored on the persistent storage 119. The instructions may be configured for execution by the processor 117 to implement one or more of the modules and/or methods described herein.

Portions of the storage module 104 (and/or the components and modules thereof) may be implemented using hardware components connected to the computing device 112 using a system bus, such as a peripheral component interconnect express (PCI-e) bus, a Serial Advanced Technology Attachment (serial ATA) bus, (USB) connection, an Institute of Electrical and Electronics Engineers (IEEE) 1394 bus (FireWire), an external PCI bus, Infiniband, and/or the like. Portions of the storage module 104 (and/or the components and modules thereof) may be embodied as computer-readable instructions configured for execution by the processor 117 of the computing device. The storage module 104 and/or storage controller 103 may comprise one or more kernel-level applications, drivers, and/or services, user-level applications, libraries, interfaces, and/or the like.

The storage module 104 may be configured to provide storage services to one or more storage clients 114 through, inter alia, the storage interface 130. The storage interface 130 may comprise a block device interface, a storage layer, a virtual storage interface (VSL), or other suitable storage interface and/or Application Programming Interface (API) for providing I/O services.

In some embodiments, the storage module 104 includes a logical-to-physical translation layer 132 to map and/or associate identifiers of the storage client 114 with storage units of the solid-state storage medium 111. The logical-to-physical translation layer 132 may provide for "any-to-any" mappings between logical identifiers and physical storage locations, such that data may be written and/or updated "out-of-place" on the solid-state storage medium 111. As used herein, a physical address refers to an address (or other reference) capable of referencing a particular storage location on the solid-state storage medium 111. Accordingly, a physical address may be a "media address."

The storage module 104 may be configured to maintain metadata 125 pertaining to solid-state storage medium 111 including, but not limited to: an index comprising the any-to-any mappings between logical identifiers and physical storage locations of the solid-state storage medium 111, a reverse index pertaining to the contents of the solid-state storage medium 111, one or more validity bitmaps, reliability characteristics, health characteristics, status metadata, and so on. The metadata may be stored on the volatile memory 118 and/or may be periodically stored on a persistent storage medium, such as the persistent storage 119 and/or solid-state storage medium 111.

The solid-state storage medium 111 may be subject to error and/or failure conditions. These conditions may result in data errors as data is written to and/or read from the solid-state storage medium 111. Such errors may arise due to a number of factors, which may include, but are not limited to: wear, over-programming, read disturb, write disturb, erase disturb, programming errors, charge gain, charge loss, charge leaking, de-trapping, and so on. Moreover, the solid-state storage medium 111 may have a limited useable lifetime. The projected useful lifetime of the solid-state storage medium 111 may be expressed in terms of the maximum number of program/erase (PE) cycles the solid-state storage medium 111 can endure before failing; a manufacturer may represent, for example, that the mean time to failure for storage the solid-state storage medium 111 is 200,000 PE cycles. Therefore, as used herein, the "wear level" of storage section 520 may correspond to the number of PE cycles that have been performed on the section 520 and/or a ratio of PE cycles to a PE cycle threshold. The PE cycle threshold may correspond to a mean PE cycles to failure for the solid-state storage medium 111, or other threshold value.

The storage module 104 may comprise a health management module 120 configured to manage the reliability and/or health of the solid-state storage medium 111. The health management module 120 may comprise a reliability monitoring module 122 configured monitor, acquire, and/or obtain characteristics indicative of the health and/or reliability of the solid-state storage medium 111 and/or different sections 520 thereof. In some embodiments, the health management module 120 is configured to quantify the health and/or reliability of storage sections 520 using "health metrics" and/or one or more "health characteristics," which may correspond to the solid-state storage medium 111 as a whole, to particular storage sections 520, to groups of storage sections 520, and/or portions of the storage sections 520, or the like. As used herein, "health metrics," refer to metrics configured to quantify the reliability of a storage section 520, which may correspond to the reliability of the solid-state storage medium 111, likelihood of successfully obtaining data stored on the solid-state storage medium 111, remaining useful life, an error rate, rate of change in health and/or reliability, and/or the like.

The health metrics and/or characteristics determined by the health management module 120 may be configured to quantify the remaining useful life and/or likelihood of failure of the solid-state storage medium 111. Accordingly, a health metric may comprise and/or correspond to reliability characteristics, such as a bit error rate (BER) and/or raw bit error rate (RBER), or the like. BER and/or RBER characteristics may be derived, at least in part, from the number of errors encountered during one or more storage operations on a storage section 520 as compared to the total amount of data transferred to and/or from the section in the one or more storage operations; the RBER of a read operation may correspond to the number of bit errors encountered in the read operation as compared to the total amount of data transferred in the read operation.

The health management module 120 may further comprise a wear management module 124. As disclosed above, a manufacturer may represent that the solid-state storage medium 111 is capable of enduring a particular amount of wear before failing (e.g., a maximum PE count or threshold). In some embodiments, the wear management module 124 is configured to distribute storage operations (e.g., program/erase operations) evenly between sections 520 of the solid-state storage medium 111, such that the wear-level (PE count) of the storage divisions 520 is generally uniform.

Through testing, experience, and research, the inventors have determined that wear level is not always an accurate measure and/or estimate of the reliability and/or remaining useful life of the solid-state storage medium 111. In some embodiments, different sections 520 of the solid-state storage medium 111 may have different reliability and/or endurance characteristics and/or wear rates. Some sections 520 may be capable of enduring higher-levels of wear (more PE cycles) than other sections due to, inter alia, different quality levels of different portions of the solid-state storage media, physical characteristics of the solid-state storage media (e.g., the location of various die, planes, etc.), different operating conditions within different portions of the solid-state storage medium 111 (e.g., different temperatures, voltages, signal attenuation, etc.), and so on.

In some embodiments, the wear management module 124 is configured to manage storage operations on the solid-state storage media 111 according to the health metrics determined by health management module 120, as disclosed above. The health metrics may incorporate additional characteristics and/or properties of the solid-state storage medium 111 to more accurately predict the reliability and/or remaining useful life. As disclosed above, a "health metric" or "reliability metric" refers to a value configured to quantify the health (e.g., remaining useful life and/or reliability) of the solid-state storage medium 111 and/or portions thereof (e.g., sections 520).

The disclosed health metrics may be based on various different characteristics, which may be combined in any suitable manner. A health metric may be based on one or more of: performance characteristics of the storage section, such as program time (e.g., the time required to program data to the storage section), erase time (e.g., the time required to erase data from the storage section), read time (e.g., the time required to perform read operations on the storage section), error rates, including, but not limited to the reliability metric(s) disclosed above, wear level (e.g., PE count, PE ratio, or the lie), rate of change in various characteristics, such as error rate, reliability or the like, and so on. In some embodiments, a health metric (H) may comprise a weighted combination of one or more factors and/or characteristics, as illustrated below:

$$H = \frac{1}{N} \sum_{i=1}^{N} w_i \cdot m_i \quad \text{Eq. 1}$$

In Equation 1, the health metric (H) comprises a weighted average of N different factors, each having a respective weight ($w_i$). In some embodiments, the health metric (H) comprises a weighted combination of program time ($P_t$) weighted by $w_{pt}$, erase time ($E_t$) weighted by $w_{et}$, wear level (PE) weighted by $w_{pe}$, and reliability or error rate ($E_R$) weighted by $w_{er}$; as illustrated below:

$$H = \frac{1}{N}(w_{pt} \cdot P_t + w_{et} \cdot E_t + w_{et} \cdot PE + w_{er} \cdot E_r) \quad \text{Eq. 2}$$

In some embodiments, the wear management module 124 may be configured to manage storage operations according to a rate of change of health metrics. The rate of change of health metrics may be used to identify storage sections 520B that are more susceptible to wear and, as such, may not be capable of implementing as many PE cycles as other, more robust sections 520 of the solid-state storage medium 11. The rate of change in various health and/or reliability characteristics may, therefore, be used as an indicator of storage health (and may be used as a health metric itself). In some embodiments, the reliability monitoring module 122 may be configured to determine the rate of change of various health-related characteristics. As illustrated below, a rate of change health metric ($H_r$) may comprise a rate of change per storage operation (SO), which may comprise a PE cycle, read operation.

$$H_r = \frac{\Delta H}{\Delta SO} \quad \text{Eq. 3}$$

The rate of change of various health metrics and/or characteristics may be indicative of which sections 520 of the solid-state storage medium 111 are degrading more quickly than other sections 520, which may allow the wear management module 124 to distribute storage operations between the sections 520, accordingly.

The health management module 120 may comprise a retirement module 123 configured to identify portions and/or sections 520 of the solid-state storage medium 111 that should be retired or taken out of service (OOS). As used herein, "retiring" a section 520 of the solid-state storage medium 111 refers to indicating that the section 520 should not be used to store data. Portions of the solid-state storage medium 111 may be taken out of service in response to various conditions including, but not limited to: failure conditions, partial failures, inaccessibility, unacceptable performance (e.g., long read, program, and/or erase times), programming errors, read errors, and the like. The OOS module 126 may be configured to manage retirement conditions within the solid-state storage medium 111, which, as disclosed in further detail herein, may comprise avoiding the sections 520, replacing certain sections 520, and/or the like. The OOS management module 126 may be configured to avoid portions of the solid-state storage medium 111 that have been taken OOS. Avoiding an OOS storage location may comprise replacing OOS storage resources with replacement resources (e.g., remapping), masking OOS storage resources (e.g., mapping nonce and/or padding data to the OOS storage location), a hybrid approach combining remapping and masking, or the like. Further embodiments of apparatus, systems, and methods for managing OOS conditions are disclosed in U.S. patent application Ser. No. 13/354,215, entitled, "Apparatus, System, and Method for Managing Out-of-Service Conditions," filed Jan. 19, 2011, which is hereby incorporated by reference.

The storage module 104 may further comprise a groomer module 128, which is configured to perform grooming operations on the solid-state storage medium 111. Grooming operations may include, but are not limited to: reclaiming storage resources, erasure, refreshing data stored on the solid-state storage medium 111, and so on. The groomer module 128 may operate outside of the path for servicing other, higher-priority storage operations and/or requests. Therefore, the groomer module 128 may operate as an autonomous, background process, which may be suspended and/or deferred while other storage operations are in process. Alternatively, the groomer module 128 may operate in the foreground while other storage operations are being serviced. The groomer 128 may wear-level the non-volatile storage media 110, such that data is systematically spread throughout different storage locations, which may improve performance, data reliability, and avoid overuse and/or underuse of particular storage locations, thereby lengthening the useful life of the solid-state storage medium 111. Recovering and/or reclaiming a storage section 520, such as an (or logical erase block) may comprise relocating valid data (if any) from the section 520, erasing the section 520, and/or initializing the section 520 for use in servicing other storage operations. Initializing may comprise marking the storage section 520 with a sequence number, and the like. In some embodiments, initializing the storage section 520 may further comprise placing a reference and/or link to the storage section 520 in a pool 148 of storage sections 520 available store data.

As disclosed above, the reliability monitoring module 122 may be configured to monitor health and/or reliability characteristics of the solid-state storage medium 111. In some embodiments, the reliability monitoring module 122 may monitor such information during normal operation of the storage module 130 (e.g., while the storage module is servicing storage requests of the storage clients 114). The reliability monitoring module 122 may query and/or be communicatively coupled with the storage controller 103 monitor storage operations performed on the solid-state storage medium 111. The reliability monitoring module 122 may be configured to gather information pertaining to: erase operations (to determine erase time); program operations (to determine program time and/or program error rates); read operations (to determine error rates and/or read time); and so on. In some embodiments, the reliability monitoring module 122 is further configured to perform test operations to determine one or more health characteristics. In some embodiments, the reliability monitoring module 122 is configured to perform periodic test read operations on the solid-state storage medium 111. A test operation may comprise reading one or more packets and/or data segments from particular storage sections 520. The test operations may further comprise determining whether the operation(s) resulted in an error (e.g., errors detected and/or corrected using the ECC correction module 322, a parity module, or the like). The reliability monitoring module 122 may be configured to perform test read operations according to a scan pattern configured to cover different sections 520 of the solid-state storage medium 111.

The health management module 120 may comprise a reliability analysis module 129 configured to determined an overall, aggregate, and/or combined health metric (and/or health model) of the solid-state storage medium 111. The overall health or reliability metric may comprise an average, mean, and/or other combination of the health and/or reliability characteristics of the sections 520 comprising the solid-state storage medium. The reliability analysis module may be configured to periodically update the aggregate health metric in response to information acquired by the reliability monitoring module 122, failure conditions, and so on.

As disclosed above, the wear management module 124 may be configured to manage the distribution of storage operations to the sections 520 of the solid-state storage medium 111 in accordance with health metrics of the solid-state storage medium 111 and/or the sections 520 themselves (as determined by the reliability monitoring module, reliability analysis module 129 and/or the like). As used herein, distributing and/or managing storage operations may comprise managing usage, wear, and/or wear-rate on the solid-state storage medium 111, which may include, but is not limited to: managing the frequency of program/erase cycles on various sections 520 of the solid-state storage medium 111, managing the type of data stored on various sections 520 of the solid-state storage medium 111, managing storage operations within particular regions of the solid-state storage medium 111 (to avoid read disturb, write disturb and/or other conditions), scheduling sequential storage operations on various sections 520 of the solid-state storage medium 111, and the like. The wear management module 124 may be configured to manage storage operations to mitigate the effects of wear on various sections 520 of the solid-state storage medium 111.

The wear level module 124 may be configured to manage usage of the solid-state storage medium 111 to equalize the health metrics across the solid-state storage medium 111, as opposed to equalizing PE count and/or other operational metrics. In some embodiments, the wear level module 124 is configured to identify sections 520 having different reliability characteristics, which may comprise identifying clusters, groups, and/or bands of sections 520 based on the health and/or reliability metrics thereof. In some embodiments, identifying sets, groups, and/or bands, of sections 520 comprises determining an overall, aggregate, and/or combined health and/or reliability metric of the solid-state storage medium 111. The overall reliability metric may correspond to reliability metrics across all of the sections 520A-N (that are currently in service) of the solid-state storage medium 111. The reliability analysis module 129 may be configured to identify sections 520 that differ from the overall reliability metric may more than a threshold. The threshold may be a pre-determined value or may be adapted according to the health and/or reliability characteristics of the solid-state storage medium 111. In some embodiments, the reliability analysis module 129 may be configured to identify sections 520 having reliability characteristics in the bottom or to 10%, differ from the average by more than a set amount, or the like. Alternatively, or in addition, the reliability analysis module 129 may be configured to identify sections 520 having a rate of change in health and/or reliability that exceeds the rate of change of other sections 520 by more than a threshold.

In the FIG. 1 embodiment, the health characteristics of storage sections 520B and 520N may be lower than those of the other storage sections 520, which as disclosed above, may indicate that the storage sections 520B and 520N are more susceptible to wear than other storage sections 520. In response, the wear management module 124 may be configured to manage storage sections to vary the wear applied to 520B and 520N. Accordingly, the sections 520B and 520N may be identified as "low-us," "gray," or "fragile," sections. As used herein, a "low-use," "reduced usage" "gray," or, "fragile" storage sections 520 refer to storage sections 520 that have health and/or reliability characteristics that differ from the health and/or reliability characteristics of other sections 520 by a threshold amount and/or exhibit a rate of change in heath characteristics that differ from a rate of change of the health characteristics of other sections 520. Other sections 520 may be classified as normal-use. In response, to identifying a low-use the wear management module 124 may manage storage operations to reduce the wear and/or usage of the sections 520B and 520N (as well as other fragile sections 520) as compared to the other sections 520. In some embodiments, the wear management module 124 may be configured to temporarily retire the low-use sections 520B and 520N. As used herein, temporarily retiring a section 520 may comprise removing the section from a queue or pool of available storage sections 520, marking the section as OOS (in Health metadata or other storage metadata), or the like.

As disclosed above, the reliability monitoring module 122 may be configured to periodically and/or continually monitor health and/or reliability characteristics of the solid-state storage medium 111. The reliability analysis module 129 may update the overall reliability metrics and/or characteristics of the sections 520 in accordance with updated information provided by the monitoring module 122. Since health and/or reliability of the sections 520 degrades over time (and in proportion to use rates of the sections 520), the health and/or reliability metrics of the low-use sections 520D and 520N may eventually converge with the overall reliability metric of the solid-state storage medium 111 (due, inter alia, to the wear management module 124 reducing wear and/or usage of the sections 520D and 520N). In response to the reliability and/or health metrics of one or more of the low-use sections 520D or 520N converging with the overall reliability and/or health characteristics of the rest of the solid-state storage medium 111 (differential less than a threshold), the wear management module 124 may be configured to return the sections 520D or 520N to the "general population" of the solid-state storage medium 111, which may comprise managing storage operations to wear and/or use the section(s) 520D and/or 520N as normal. If the section 520D and/or 520N was temporarily retired, the wear management module 124 may "un-retire" the section 520D and/or 520N, which may comprise placing the section into a queue and/or pool of available storage sections 520, marking section 520D and/or 520N as available, or the like.

The reliability analysis module 1222 may determine that another storage section 520C has health and/or reliability characteristics that exceed the overall reliability and/or health metric; such sections (e.g., section 520C) may be identified as a "robust" or "healthy." In response, the wear management module 124 may be configured to manage storage operations to increase the wear and/or usage rate on the section 520C and/or other robust sections 520. Increased wear and/or usage may result in decreasing the health and/or reliability of the section 520C more rapidly than other sections 520. As such, the health and/or reliability metric of the section 520 may converge with the other sections 520 over time and, in response, the wear management module 124 may be configured to manage storage operations to reduce the load on the section 520C to normal levels.

As illustrated above, the wear level management module 124 may be configured to use health and/or reliability metrics to evenly wear and/or use the solid-state storage medium 111. The wear level management module 124 may manage the distribution and/or allocation of storage based on health and/or reliability metrics as opposed to the PE count alone. Accordingly, the overall health of the media may be evenly distributed based on actual, observed performance and/or reliability metrics as opposed to PE cycle count alone.

The wear level management module 124 may be configured to manage storage operations in various different ways including, but not limited to: managing the pool and/or queue 148 of available storage sections 520, managing the operation of a groomer module 128 (disclosed in further detail herein), and/or managing the operation of the retirement module 123 and/or OOS management module 126 (to, inter alia, temporarily retire one or more sections 520).

Figure 2A:
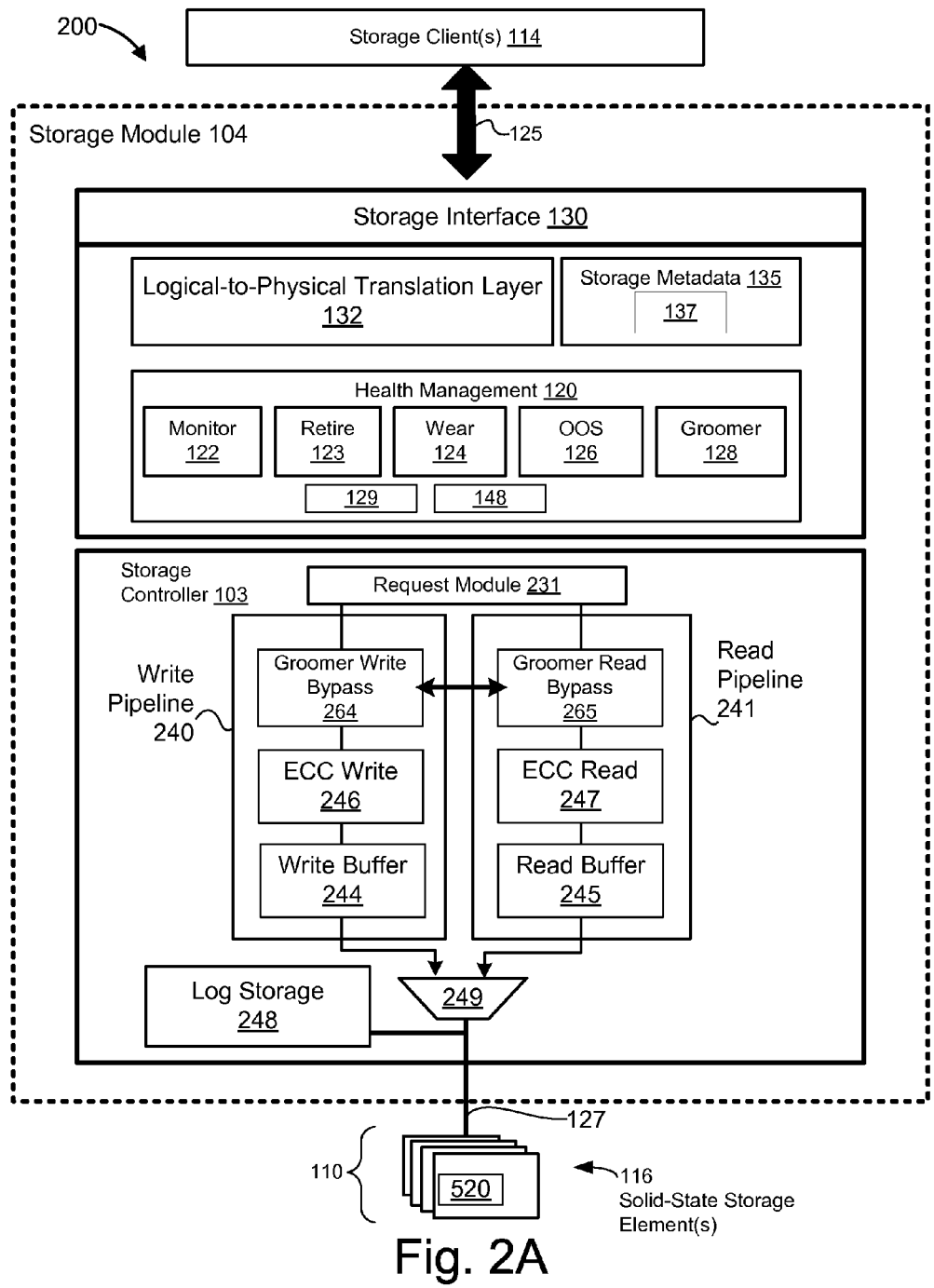
FIG. 2A is a block diagram of another embodiment of a system for wear management for solid-state storage media.

FIG. 2A is a block diagram depicting another embodiment of a system 200 for wear management. storage module 104 configured to manage data storage operations on a solid-state storage media 110. In some embodiments, the solid-state storage media 110 may comprise a plurality of solid-state storage elements, which may be communicatively coupled to the solid-state media controller 103 via a bus 127. As used herein, a solid-state storage element refers to an element comprising a solid-state storage medium 111, and may include, but not limited to solid-state storage media 111 embodied as: a package, a chip, die, plane, printed circuit board, and/or the like. The solid-state storage media 110 may comprise a plurality of solid-state storage elements (an array of solid-state storage elements). Groups or banks of solid-state storage elements may be communicatively coupled to the storage controller 103 in parallel, forming one or more logical storage elements. As used herein, a logical storage element refers to a set of two or more solid-state storage elements that are capable of being managed in parallel (e.g., via an I/O and/or control bus 127). A logical storage element may comprise a plurality of logical storage units, such as logical pages, logical erase blocks, or the like. As used herein, a "logical storage unit" refers to a logical construct combining two or more physical storage units, each physical storage unit on a respective solid-state storage element (each solid-state storage element being accessible in parallel). A logical erase block refers to a set of two or more physical erase blocks. In some embodiments a logical erase block may comprise erase blocks within respective logical storage elements and/or banks. Alternatively, a logical erase block may comprise erase blocks within a plurality of different logical storage elements and/or may span multiple banks of solid-state storage elements.

The solid-state media controller 103 may comprise a request module 231 configured to receive storage requests from the storage module 104 and/or other storage clients 114. The request module 231 may be configured to perform storage operations on the solid-state storage media 110 in response to the requests, which may comprise transferring data to/from the storage module 104 and/or storage clients 114. Accordingly, the request module 231 may comprise one or more direct memory access (DMA) modules, remote DMA modules, bus controllers, bridges, buffers, and the like.

The solid-state media controller 103 may comprise a write module 240 that is configured to process data for storage on the solid-state storage media 110. In some embodiments, the write module 240 comprises one or more data processing stages, which may include, but are not limited to: compression, encryption, packetization, media encryption, error encoding, and so on.

Error encoding may comprise encoding data packets (or other data containers) in an error-correcting code (ECC) using, inter alia, the ECC write module 246. ECC encoding may comprise generating ECC codewords, each of which may comprise a data segment of length N and a syndrome of length S. For example, the ECC write module 246 may be configured encode data segments into 240 byte ECC chunks, each ECC chunk comprising 224 bytes of data and 16 bytes of ECC data. In this embodiment, the ECC encoding may be capable of correcting more bit errors than the manufacturer of the solid-state storage media 110 requires. In other embodiments, the ECC write module 246 may be configured to encode data in a symbolic ECC encoding, such that each data segment of length N produces a symbol of length X. The ECC write module 246 may encode data according to a selected ECC "strength." As used herein, the "strength" of an error-correcting code refers to the number of errors that can be detected and/or corrected by use of the error correcting code. In some embodiments, the strength of the ECC encoding implemented by the ECC write module 246 may be adaptive and/or configurable. In some embodiments, the strength of the ECC encoding may be selected according to the reliability and/or error rate of the solid-state storage media 110.

The ECC write module 246 may be further configured to calculate parity data for one or more data segments (or other data structures). The parity data may be used with (or in place of) the ECC encoding, described above. Parity data may be used to detect and/or correct errors in data stored on the solid-state storage medium 110 (e.g., using parity substitution, as described below).

The write module 240 may be configured to store data in a "contextual format" on the solid-state storage media 110. As used herein, a contextual format refers to a data format in which a logical interface of a data segment is associated with the data segment on the solid-state storage media 110. For example, a contextual packet format may include a packet header comprising one or more logical identifiers of a data segment, or the like. The contextual format may be used to reconstruct the logical-to-physical translation layer 132 (and/or storage metadata 135) of the storage module 104, in the event storage metadata 135 (e.g., forward index) of the storage module 104 is lost or corrupted.

The write buffer 244 may be configured to buffer data for storage on the solid-state storage media 110. In some embodiments, the write buffer 244 may comprise one or more synchronization buffers to synchronize a clock domain of the solid-state media controller 103 with a clock domain of the solid-state storage media 110 (and/or bus 127).

The log storage module 248 may be configured to select media storage location(s) for data storage and/or may provide addressing and/or control information to the non-volatile storage media 110 via the bus 127. Accordingly, the log storage module 248 may provide for storing data sequentially at an append point within the physical address space of the solid-state storage media 110. The physical address at which a particular data segment is stored may be independent of the logical interface (e.g., logical identifier) of the data segment.

The logical-to-physical translation layer 132 may be configured to associate the logical interface of data segments (e.g., logical identifiers of the data segments) with the physical address(es) of the data segments on the solid-state storage media 110. In some embodiments, the logical-to-physical translation layer 132 may comprise storage metadata 135, which may include a forward index comprising arbitrary, any-to-any mappings between logical identifiers and media addresses. The storage metadata 135 may be maintained in volatile memory, such as the volatile memory 118. In some embodiments, the storage module 104 is configured to periodically store portions of the storage metadata 135 on a persistent storage medium, such as the solid-state storage media 110, persistent storage 119, or the like.

The solid-state media controller 103 may further comprise a read module 241 that is configured to read data from the solid-state storage media 110 in response to requests received via the request module 231. The requests may comprise and/or reference the logical interface of the requested data, such as a logical identifier, a range and/or extent of logical identifiers, a set of logical identifiers, or the like. The physical addresses associated with data of the request may be determined based, at least in part, upon the logical-to-physical translation layer 132 (and/or storage metadata 135) maintained by the storage module 104. Data may stream into the read module 241 via the read buffer 245 and in response to addressing and/or control signals provided via the bus 127. The read buffer 245 may comprise one or more read synchronization buffers for clock domain synchronization, as described above.

The read module 241 may be configured to process data read from the non-volatile storage media 110, and provide the processed data to the storage module 104 and/or a storage client 114. The read module 241 may comprise one or more data processing stages, which may include, but are not limited to: error correction, media decryption, depacketization, decryption, decompression, and so on. Data processed by the read module 241 may flow to the storage module 104 and/or storage client 114 via the request module 231, and/or other interface or communication channel (e.g., the data may flow directly to/from a storage client via a DMA or remote DMA module of the storage module 104).

The read module 241 may comprise an ECC read module 247 configured to detect and/or correct errors in data read from the solid-state storage media 110 using, inter alia, the ECC encoding of the data (e.g., as encoded by the ECC write module 246), parity data (e.g., using parity substitution), and so on. The ECC encoding may be capable of detecting and/or correcting a pre-determined number of bit errors, in accordance with the strength of the ECC encoding. The ECC read module 247 may be capable of detecting more bit errors than can be corrected.

The ECC read module 247 may be configured to correct any "correctable" errors using the ECC encoding. In some embodiments, the ECC read module 247 may attempt to correct errors that cannot be corrected using the ECC encoding using other techniques, such as parity substitution, or the like. Alternatively, or in addition, the ECC read module 247 may attempt to recover data comprising uncorrectable errors from another source. For example, in some embodiments, data may be stored in a RAID configuration. In response to detecting an uncorrectable error, the ECC read module 247 may attempt to recover the data from the RAID, or other source of redundant data (e.g., a mirror, backup copy, or the like).

In some embodiments, the ECC read module 247 may be configured to generate an interrupt in response to reading data comprising uncorrectable errors. The interrupt may comprise a message indicating that the requested data is in error, and may indicate that the ECC read module 247 cannot correct the error using the ECC encoding. The message may comprise the data that includes the error (e.g., the "corrupted data"). The interrupt may be caught by the storage module 104 or other process.

In some embodiments, the storage module 104 may correct errors in corrupted data using alternative error correction techniques, such as parity substitution, or the like. Parity substitution may comprise iteratively replacing portions of the corrupted data with a "parity mask" (e.g., all ones) until a parity calculation associated with the data is satisfied. The masked data may comprise the uncorrectable errors, and may be reconstructed using other portions of the data in conjunction with the parity data. Alternatively, the storage module 104 may replace the corrupted data with another copy of the data, such as a backup or mirror copy, and then may use the replacement data of the requested data packet or return it to the read module 241. In another embodiment, the storage module 104 stores data in a RAID configuration, from which the corrupted data may be recovered, as described above.

Further embodiments of apparatus, systems, and methods for detecting and/or correcting data errors are disclosed in United States Patent Application Publication No. 2009/0287956 (Ser. No. 12/467,914), entitled, "Apparatus, System, and Method for Detecting and Replacing a Failed Data Storage," filed May 18, 2009, which is hereby incorporated by reference in its entirety. The solid-state media controller 103 may further comprise a multiplexer 249 that is configured to selectively route data and/or commands between the write module 240 and read module 241, and solid-state storage media 110. In some embodiments, solid-state media controller 103 may be configured to read data while filling the write buffer 244 and/or may interleave one or more storage operations on one or more banks of solid-state storage elements (as described below in conjunction with FIG. 4A). Further embodiments of write and/or read modules are disclosed in United States Patent Application Publication No. 2008/0141043 (Ser. No. 11/952,091), entitled, "Apparatus, System, and Method for Managing Data using a Data Pipeline," filed Dec. 6, 2007, which is hereby incorporated by reference in its entirety.

As disclosed above, the groomer module 128 may be configured to reclaim storage resources on the solid-state storage media 110. The groomer module 128 may operate as an autonomous, background process, which may be suspended and/or deferred while other storage operations are in process. The wear manager 124 may be configured to leverage the groomer module 128 to manage wear and/or usage of sections 520 of the solid-state storage media 110 based on health and/or reliability metrics, as disclosed above.

In some embodiments, the groomer module 128 may interleave grooming operations with other storage operations and/or requests. For example, reclaiming a storage resource, such as an erase block or logical erase block (e.g., set of two or more erase blocks), may comprise relocating valid data stored on the logical erase block to other storage locations on the solid-state storage media 110. The groomer write and groomer read bypass modules 264 and 265 may be configured to allow data packets to be read into the read module 241 and then be transferred directly to the write module 240 without being routed out of the storage media controller 103.

The groomer read bypass module 265 may coordinate reading data to be relocated from the storage resource that is being reclaimed. The groomer module 128 may be configured to interleave the relocation data with other data being written to the non-volatile storage media 110 via the groomer write bypass 264. Accordingly, data may be relocated without leaving the solid-state media controller 103. In some embodiments, the groomer module 128 may be configured to fill the remainder of the write buffer 244 with relocation data, which may improve groomer efficiency, while minimizing the performance impact of grooming operations.

Figure 2B:
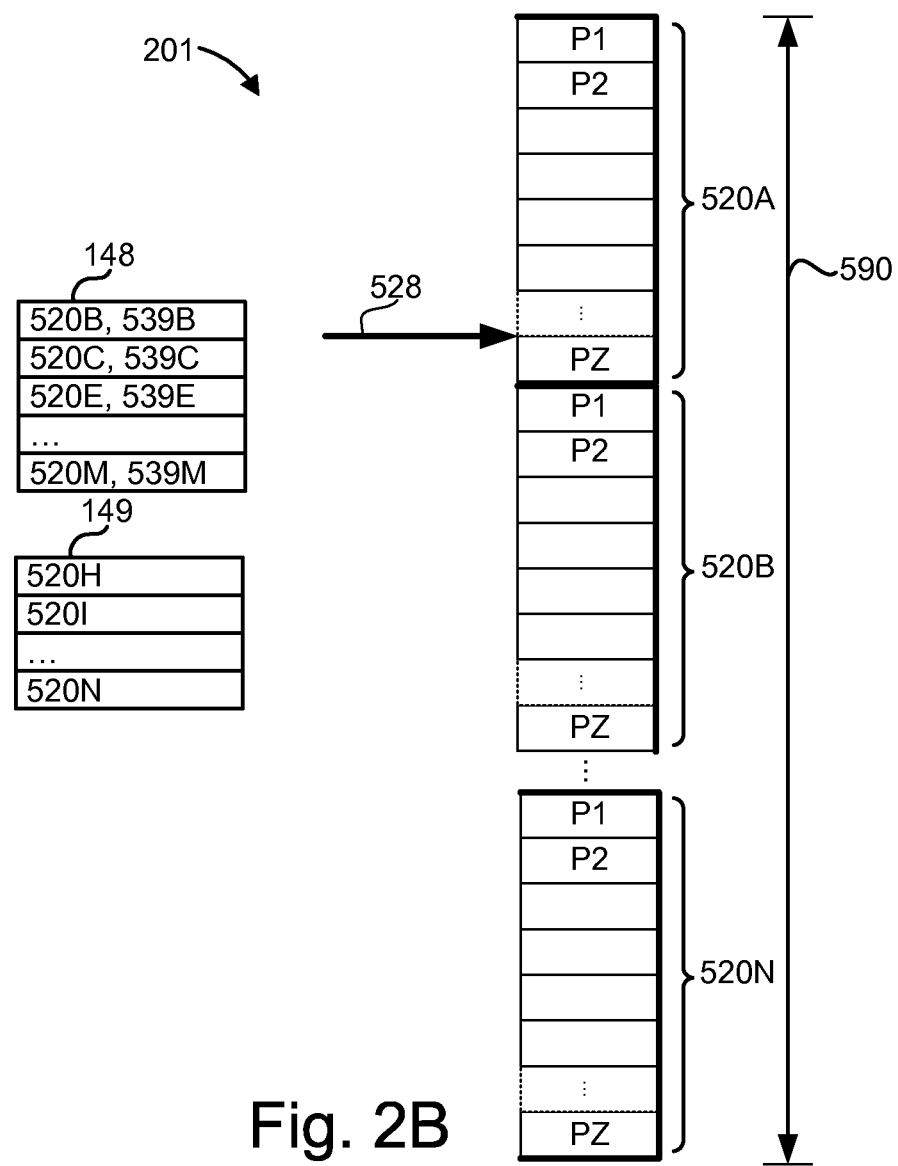
FIG. 2B is a block diagram depicting one embodiment of sequential storage operations.

As disclosed above, the write module 240 and log storage module 248 may be configured to store data sequentially within the solid-state storage media 110. Referring to FIG. 2B, the storage controller 103 and/or log storage module 248 may be configured to store data sequentially within a physical address space 590 of the solid-state storage media 110. The physical address space 590 of the solid-state storage medium may be partitioned into a plurality of sections 520A-N, which, as disclosed above, may comprise erase blocks, logical erase blocks, or the like. The each section 520A-N may comprise a plurality of storage units P1-Z, which may comprise pages, logical pages, or the like. The log storage module 428 may configure the write module 240 to store data sequentially at an append point 528. The log storage module 248 may sequentially write data to the storage units P1-PZ of the storage section 520, until the end of the storage section PZ is reached. The log storage module 248 may then advance the append point to a next available storage section 520B-520N. After reaching the end of the physical address space (PZ of section 520N), the append point resumes back at storage section 520A P1 (if available).

The groomer module 128 may be configured to identify sections 520A-N for recovery. As disclosed above, recovery may comprise relocating valid data from a section 520 and initializing the section 520, which may include erasing the section 520 and placing the section in a pool 148 of sections 520 that are available for storing data. When the append point 528 reaches the end of the section 520A, the log storage module 248 may determine the next section 520 to use to store data. In the FIG. 2B embodiment, the next storage section may be 520B.

The wear management module 124 may be configured to manage and/or adapt the sequential storage operations to change the wear and/or usage of the sections 520A-N in accordance with their respective health and/or reliability metrics. In the FIG. 2B embodiment, the section 520B may be considered to be a fragile, "low use" storage division. Accordingly, the wear management module 124 may remove the entry 520B from the pool 148; as such, the append point 528 may skip section 520B and resume at 520C. Alternatively, or in addition, the pool 148 may comprise an ordered and/or prioritized queue, and the sections therein may be associated with corresponding priority metadata 539B . . . M. The priority metadata 539B associated with the low-use section 520B may indicate that the section is to be "skipped" a particular number of times, modifying the normal sequential of storage operations within the physical address space 590. The wear management module 124 may be configured to skip the storage section 520B N times before setting the append point to 520B. The iteration and/or skip count associated with the section 520B may be maintained in the priority metadata 539B.

The priority metadata of other sections, such as section 520C may indicate that the section is a robust section (based on the health and/or reliability characteristics thereof). In response, the log storage module 248 may be configured to prioritize selection of the section 520C over other sections in the pool 148, which may increase wear and/or usage of the section 520C, as disclosed above.

In some embodiments, the pool 148 may comprise a secondary, low-priority pool 149 comprising sections 520 identified as being fragile and/or low-use, as disclosed above. The log storage module 248 may select storage sections 520 from the low-priority pool 149 less frequently than the pool 148 to reduce wear and/or usage on the sections 520 therein. In some embodiments, the pool 148 may further comprise a high-priority pool (not shown) comprising robust sections 520. The log storage module 248 may be configured to select storage sections 520 from the high-priority pool more frequently, to increase the wear and/or usage on the sections 520 therein.

In some embodiments, the storage module 130 may be configured to maintain access metadata pertaining data stored on the solid-state storage medium 110. The access metadata may identify data that is "low-use" or "cold," which may include data that is infrequently accessed, written, and/or modified. Other data may be identified as "high-use" or "hot," which may include data that is frequently accessed, written, and/or modified. The wear management module 124 may be configured to manage wear and/or usage based on the access metadata associated with various storage operations. In some embodiments, the wear management module 124 is configured to cause data identified as low-use and/or cold to be stored on low-use and/or fragile storage sections 520. Accordingly, the wear management module 124 may be configured to instruct the log storage module to modify the append point 528 to store data of one or more storage requests in a storage section in the low-priority queue 149 and/or having low-priority metadata 539B. The wear management module 124 may be further configured to configure the write module 240 to store high-use, hot data on robust storage sections 520, which may comprise configuring the log storage module 248 to select one or more identified storage sections (section 520C) to service particular storage requests.

The wear management module 124 may be configured to manage wear and/or usage of the storage sections 520 by use of the groomer module 128. As disclosed above, the groomer module 128 may be configured to iterate through the physical address space 590 to identify sections 520 to reclaim. A storage section 520 may be selected for reclamation based on the amount of invalid data on the section 520, age of the data on the section 520, capacity constraints, and the like. Recovering a storage section 520 may comprise relocation valid data from the section 520 (to other sections via the groomer bypass 264 and/or 265 disclosed above). The recovery operations may further comprise erasing the section and placing the section the pool 148, as disclosed above. The wear management module 124 may be configured to delay recovery of low-use and/or fragile storage sections 520 by, inter alia, allowing the groomer module 128 to relocate data from the storage section 520, but instructing the groomer module 128 to deter initializing the section 520 (e.g., defer erasing, marking, and/or placing the section 520 into the pool 148). The wear management module 124 may be configured to instruct the groomer module 128 to defer initialization for a particular time period and/or a particular number of grooming passes through the physical address space 590. Deferring initialization may reduce the frequency at which fragile sections are used without requiring modifications to the pool and/or queue 148.

Figure 3:
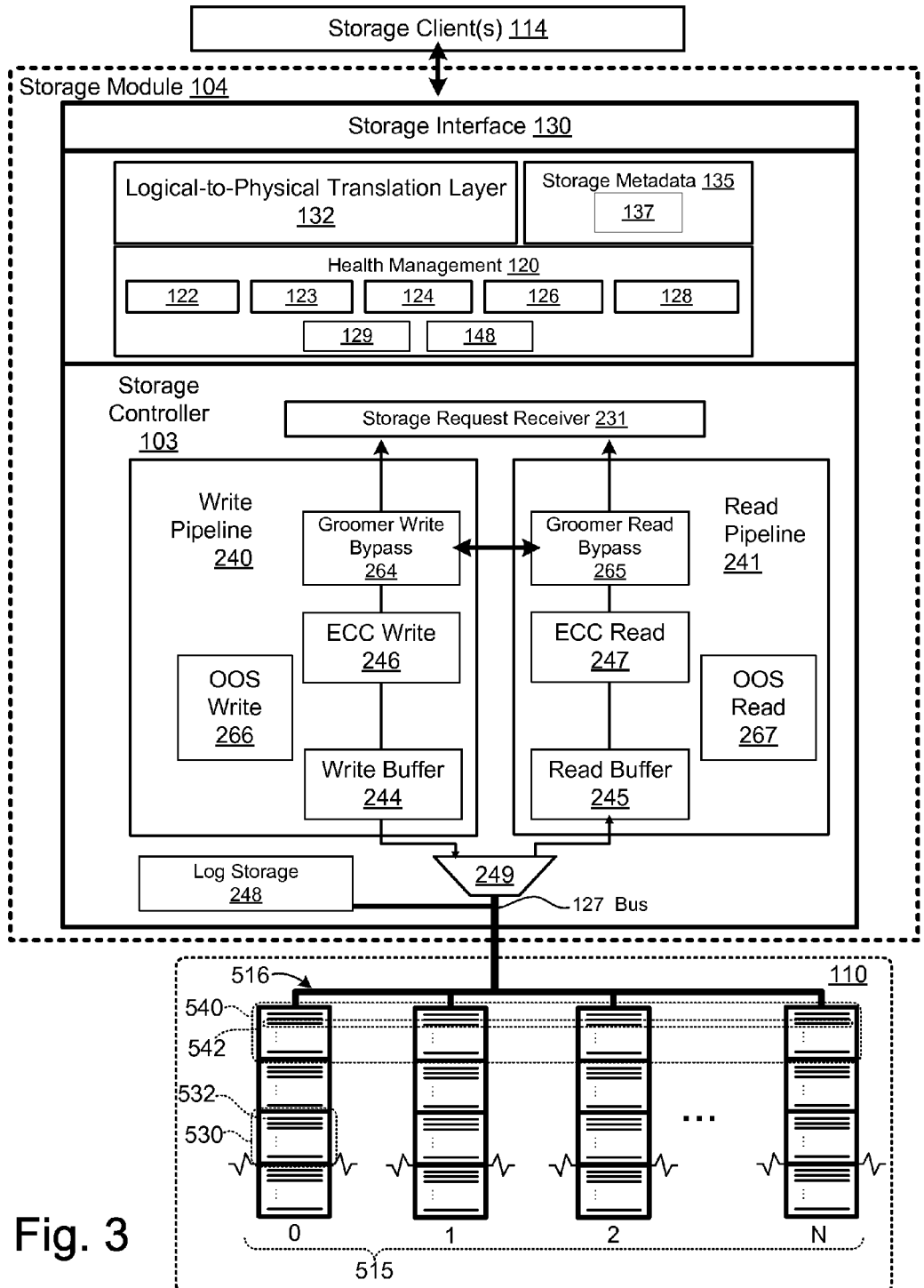
FIG. 3 is a block diagram of another of a system for wear management for solid-state storage media.

FIG. 3 depicts another embodiment of a system 300 for managing wear of a solid-state storage media 110. In the FIG. 3 embodiment, the solid-state storage media 110 may comprise a plurality of solid-state storage elements 516 (elements 516 0 through N). Each solid-state storage element 516 may be partitioned into a plurality of erase blocks 530. Each erase block may comprise a plurality of storage units (e.g., pages) 532. Each storage unit 532 may be addressable by the solid-state media controller 103. The solid-state storage elements 516 may be communicatively coupled to the solid-state media controller 103 (via the bus 127), and the solid-state media controller 103 may be configured to manage the solid-state storage elements 516 as a logical storage element 515. The wear management module 124 may be configured to manage storage operations on the logical storage element 515 to modify the wear and/or usage of various portions of the solid-state storage medium 110 in accordance with health conditions of various portions and/or sections of the logical storage element 515, as disclosed herein.

Figure 4A:
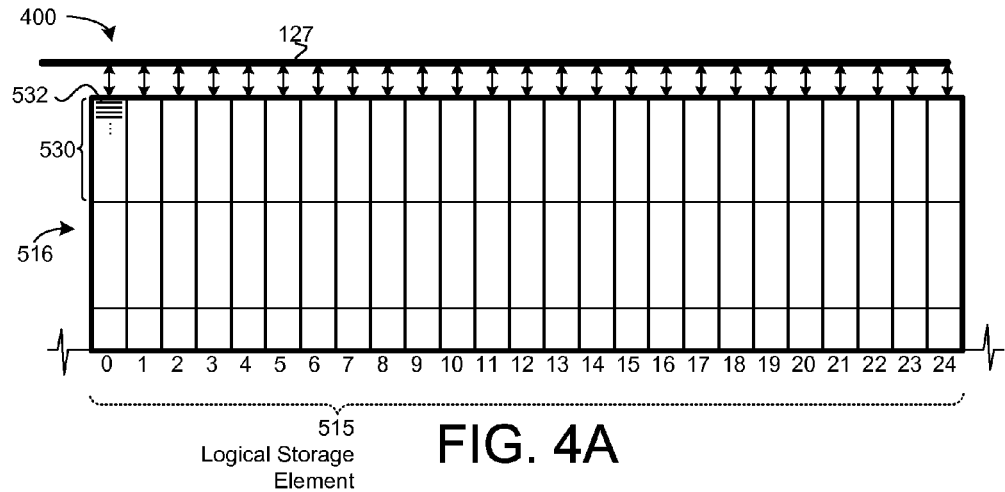
FIG. 4A is a block diagram of one embodiment of storage sections comprising a logical storage element.

FIG. 4A is a block diagram of one embodiment 400 of a logical storage element 515 comprising a plurality of solid-state storage elements 516. The FIG. 4A embodiment includes twenty-five (25) solid-state storage elements 516 connected via a bus 127. The bus 127 may couple the logical storage element 515 to the storage module 104 (through the solid-state media controller 103), as described above. In some embodiments, storage operations performed on the logical storage element 515 may be performed on a plurality of the constituent solid-state storage elements 516 in parallel; when data is read and/or written to the logical storage element 515, the data may be read and/or written to a plurality of the physical storage elements 516.

The solid-state storage elements 516 may be embodied on separate chips, packages, die, or the like. Alternatively, or in addition, one or more of the solid-state storage elements 516 may share the same package and/or chip (e.g., be separate die and/or planes on the same chip). The solid-state storage elements 516 comprise respective erase blocks 530, each comprising a plurality of storage units 532 (e.g., pages). However, the disclosure could be adapted to use different types of solid-state storage media 110 comprising different media partitioning schemes and, as such, should not be read as limited in this regard.

Figure 4B:
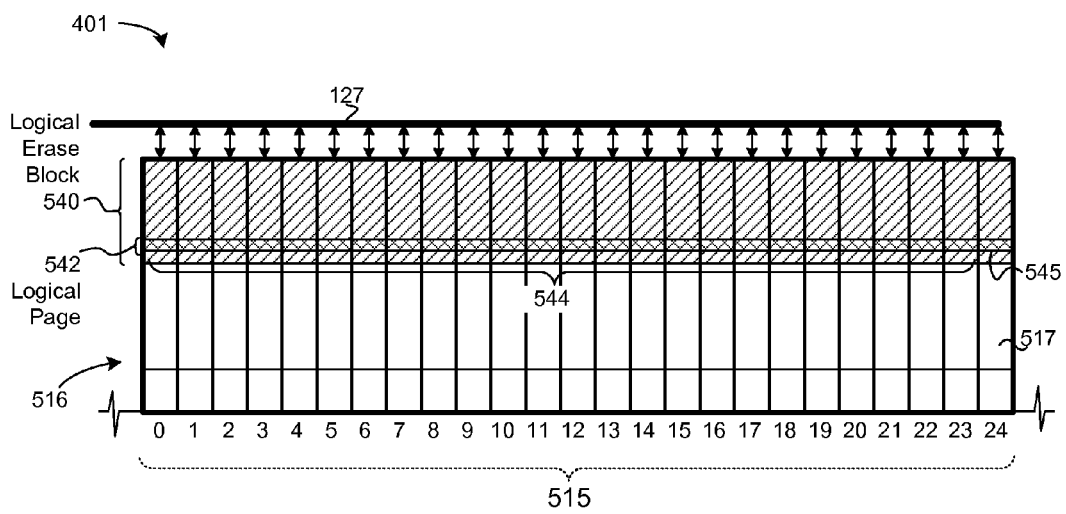
FIG. 4B is a block diagram of one embodiment of storage sections comprising a logical storage element.

The storage module 104 may be configured to perform storage operations on logical storage units 542 and/or logical erase blocks 540 of the logical storage element 515. In the FIG. 4B embodiment 401, each logical erase block 540 comprises an erase block 530 of a respective storage element 516 "0" through "24," and each logical page 542 comprises a physical page 532 of a respective storage element 516 "0" through "24." Accordingly, each logical erase block 540 may comprise as many as twenty-five (25) erase blocks 530, and each logical page 542 may comprise as many as twenty-five (25) physical pages 532. Although the logical erase block 540 of FIG. 4B includes erase blocks 530 within a single logical storage element 515, the disclosure is not limited in this regard; in some embodiments, described below, the logical erase block 540 may span a plurality of logical storage elements 515 and/or banks of storage elements 516.

The storage module 104 may be configured to perform storage operations on logical storage element 515, which may operate across the constituent solid-state storage elements 516: an operation to read a logical page 542 comprises reading from as many as twenty-five (25) physical pages 532 (e.g., one storage unit per solid-state storage element 516); an operation to program a logical page 542 comprises programming as many as twenty-five (25) physical pages 532; an operation to erase a logical erase block 540 comprises erasing as many as twenty-five (25) erase blocks 530; and so on. Accordingly, the effective read/write bandwidth of the logical storage element 515 may be proportional to the number of solid-state storage elements 516 included therein.

Arranging solid-state storage elements 516 into logical storage elements 515 may be used to address certain properties of the solid-state storage media 110. For example, the solid-state storage media 110 may have asymmetric properties; it may take ten (10) times as long to program data on a solid-state storage element 516 as it takes to read data from the solid-state storage element 516. Moreover, in some cases, data may only be programmed to erase blocks 530 that have been initialized (e.g., erased). An erase operation may take ten (10) times as long as a program operation (and by extension one hundred (100) times, or more, longer than a read operation).

The arrangement of the solid-state storage elements 516 into logical storage elements 515 (and/or interleaved banks as described herein), may allow the storage module 104 to address the asymmetric properties of the solid-state storage media 110. In some embodiments, the asymmetry in read, program, and/or erase operations is addressed by performing these operations on many elements 516 in parallel (e.g., on a logical storage element 515). In the FIG. 4B embodiment, programming asymmetry may be addressed by programming twenty-five (25) physical pages 532 in a logical page 542 in parallel. Performing multiple program operations in parallel may increase the effective write or programming bandwidth. The effective program bandwidth of the logical storage element 515 depicted in FIGS. 4A and 4B may be as much as twenty-five (25) times that of the program bandwidth of the same twenty-five (25) solid-state storage elements 516 in serial. The increase to programming bandwidth may be used to "mask" the asymmetry between write/program and read operations. Erase operations may be performed on a multiple erase blocks (e.g., logical erase blocks 540). Erasing a logical erase block 540 may, therefore, comprise erasing twenty-five (25) separate erase blocks 530 in parallel. Like the logical programming operations described above, implementing erase operations on logical erase blocks 540 in parallel may allow the storage module 104 to manage asymmetry between erase, program, and read operations.

In some embodiments, a certain portion of a logical storage element 115 may be configured to store error detection and/or recovery data. For example, one of the storage elements 516 (denoted 517 in FIG. 4B) may be used to store parity data. In this embodiment, the effective capacity and/or bandwidth of the logical storage element 515 may be reduced (e.g., reduced from twenty-five (25) physical pages 530 to twenty-four (24) physical pages 530); the first twenty-four (24) physical pages 544 are used to store data, and physical page 545 is dedicated to storing parity data. As used herein, "effective capacity and/or bandwidth" refers to the number of storage units or divisions that are available to store data and/or the total amount of data that can be stored and/or read in parallel. The operational mode described above may be referred to as a "24+1" configuration, denoting that twenty-four (24) physical storage units are available to store data, and one (1) of the physical storage units is used for parity data. The logical storage element 515 could be configured to operate in any number of operational modes, in which any proportion of the solid-state storage elements 516 are used to store error detection and/or recovery data, and as such, the disclosure should not be read as limited in this regard.

As illustrated above, the storage module 104 may be configured to perform storage operations on logical storage units (logical pages 542) of the solid-state storage media 110, each of which may comprise as many as twenty five erase blocks 530. The health management module 120 may be configured to track reliability metrics of the solid-state storage medium 110 at a corresponding level of granularity. Accordingly, the health management module 120 may be configured to determine reliability characteristics of storage sections that correspond to the logical erase blocks 540, which, as disclosed herein, may comprise combining the reliability metrics of individual erase blocks 530.

Although particular embodiments of logical storage elements 515 as disclosed herein, the disclosure is not limited in this regard and could be adapted to incorporate logical storage elements 515 of differing sizes and/or configurations. The size and number of erase blocks, pages, planes, or other logical and physical divisions within the solid-state storage elements 516 are expected to change over time with advancements in technology; it is to be expected that many embodiments consistent with new configurations are possible and are consistent with the embodiments disclosed herein. Moreover, the storage controller 103 may be configured to layout data onto the logical storage element 515 according to different adaptive configurations, as disclosed in U.S. patent application Ser. No. 13/830,652, entitled "Systems and Methods for Adaptive Error-Control Coding," filed Mar. 14, 2013 for Jeremy Fillingim et al, and which is hereby incorporated by reference.

Referring back to FIG. 3, as disclosed herein, the storage controller 103 may be configured to continue operating when storage units in the solid-state storage media 110 are taken out of service, and/or to manage wear for health conditions (as instructed by the wear management module 124).

As disclosed above, the health module 120 may be configured to gather profiling information pertaining to the solid-state storage media 110 (by use of the reliability monitor module 122); the reliability information may include, but is not limited to: error information (e.g., RBER), performance metrics, wear levels (e.g., PE cycles), and so on. The reliability information may be used by the reliability analysis module 129 to determine reliability and/or health characteristics and corresponding metrics for various sections of the solid-state storage medium 110 (e.g., logical erase blocks 540, erase block 530, and so on). The wear management module 124 may use the reliability and/or health metrics to, inter alia, identify low-use and/or high-use sections of the solid-state storage medium 110 and may manage storage operations accordingly. The reliability module 123 may leverage to reliability and/or health metrics to identify portions of the solid-state storage medium 110 that should be retired. In some embodiments, the wear management module 124 may configure the reliability module 123 and/or OOS management module 126 to manage low-use sections as if the sections were OOS, to thereby reduce wear on the sections. The wear management module 124 may be further configured to bring the sections back into service in response to overall health of the solid-state storage medium degrading to the same (or sufficiently similar) level as the low-use sections, as disclosed above.

The OOS management module 126 may be configured to track storage resources that have been taken out of service and/or are being managed as low-wear and/or fragile. In some embodiments, the OOS management module 126 tracks OOS conditions in the solid-state storage media 110 using health metadata 137. The health metadata 137 may be detected and/or tracked at varying levels of granularity; health conditions may be tracked and/or maintained by page, logical page, erase block, logical erase blocks, die, chips, planes, and/or according to other storage partitions or divisions. The health management module 120 may be configured to maintain reliability information for storage divisions comprising a plurality of erase blocks, in accordance with the logical storage element 515 and/or logical pages 542 of FIGS. 4A and 4B. The disclosure should not be read as limited in this regard, however, and could be applied to any size and/or organization of non-volatile storage media 110. The storage module 104 may be configured to manage OOS conditions using one or more of a remapping approach, masking approach, hybrid approach, or the like.

In some embodiments, the storage module 104 is configured to manage OOS and/or health conditions using a "remapping" approach, in which the bus 127 includes addressing information for each solid-state storage element 516 in the logical storage element 515 (e.g., each storage element 516 may receive a respective physical address via the bus 127). The storage module 104 may leverage the separate addressing information to remap replacements for one or more OOS storage resources from other portions of the solid-state storage media 110. The OOS management module 126 may use remapping to prevent a few OOS erase blocks 530 from taking an entire logical erase block 540 out of service. As disclosed above, in some embodiments, the wear management module 124 is configured to use the OOS management module 126 to manage low-usage conditions within logical erase blocks 540. In some embodiments, the OOS management module 126 may be configured to treat low-wear portions of a logical erase block 540 as temporarily OOS, to reduce wear on the portion while allowing other portions of the logical erase block 540 to continue being used to store data.

The OOS management module 126 may be configured to manage OOS and/or health conditions using an "masking approach." in which OOS and/or health conditions are managed by masking physical storage units that are OOS (if any). As used herein, masking an OOS storage location, such as an erase block 530, may comprise configuring the write module 240 to inject padding data into the write buffer 244, such that the padding data is mapped to the OOS storage locations on the bus 127 during programming operations. Masking may further comprise configuring the read module 241 to ignore (or otherwise avoid) data read from OOS storage locations during read operations. Masking OOS storage units may reduce the storage capacity and/or effective bandwidth of portions of the logical storage element 515, while allowing the remaining in-service storage divisions 530 to continue in operation. As used herein, padding or masking data refers to any data that is used in place of valid data. Accordingly, padding data may be actively added as a particular data pattern (e.g., ones, zeros, or other patterns) or may be added passively by reusing whatever data is on the bus 127 (or write module 240), allowing portions of the bus 127 to float, or the like.

In some embodiments, the OOS management module 126 is configured to manage OOS conditions using a hybrid approach, in which OOS and/or health conditions are managed by masking the OOS and/or low-use storage units (if any), as disclosed above. The masking approach may be used until the number of OOS and/or low-use storage locations reaches a threshold. When the threshold is reached, the storage module 104 may be configured to implement the bad block remapping approach to replace one or more of the OOS physical storage units from other portions of the solid-state media 110, as described above. OOS storage units for which there are no available replacements may continue to be managed using the masking approach. Further embodiments of apparatus, systems, and methods for managing OOS conditions are disclosed in U.S. patent application Ser. No. 13/354, 215, entitled, "Apparatus, System, and Method for Managing Out-of-Service Conditions," filed Jan. 19, 2011, which is hereby incorporated by reference in its entirety.

In the FIG. 3 embodiment, the solid-state media controller 103 may comprise an OOS write module 266 configured to manage OOS conditions in the write module 240 (e.g., remap and/or mask OOS storage resources). During write operations, the OOS write module 266 may be configured to identify storage resources that are OOS using, inter alia, the health metadata 137. The OOS write module 266 may access the health metadata 137 from an internal metadata storage unit, driver, storage module 104, or the like. Alternatively, or in addition, the OOS management module 126 may be configured to push health metadata 137 to the solid-state media controller 103 via the request receiver module 231 (e.g., health metadata 137 may be included with storage requests).

The OOS write module 266 may be configured to manage OOS and/or health conditions using one or more of a remapping approach, masking approach, hybrid approach, or the like, as disclosed above. The OOS write module 266 (or other command and control module) may be configured to implement a remapping approach to replace OOS and/or low-use storage resources with other, available storage resources. The remapping approach may comprise identifying other, available storage resources and modifying one or more addresses and/or command signals on the bus 127 to replace OOS and/or low-use storage resources with the identified replacement resources (e.g., using the log storage module 248). The OOS write module 266 may be further configured to implement a masking approach, which may comprise injecting padding data into the write buffer 244 (or other portions of the write module 240), such that the padding data is mapped to the OOS and/or low use storage resources identified by the Health metadata 137. The OOS write module 266 may be further configured to implement a hybrid approach, in which the OOS write module 266 masks a threshold number of OOS and/or low-use storage resources, and then implements bad block remapping (where available) thereafter.

The OOS read module 267 may be configured to manage OOS and/or health conditions in the read module 241 using one or more of a remapping approach, masking approach, hybrid approach, or the like, as described above. In a bad block remapping approach, the OOS read module 267 may be configured to identify the replacement addresses for OOS and/or low-use storage resources (if any) and set addressing and/or control signals on the bus 127 accordingly (e.g., by use of the log storage module 248). In a masking approach, the OOS read module 267 may be configured to strip (or otherwise ignore) data read corresponding to OOS and/or low-use storage resources (e.g., strip padding data from the read buffer 245 before the data is processed through the rest of the read module 241). In a hybrid approach, the OOS read module 267 may be configured to selectively remap storage resources and/or strip data from the read buffer 245 in accordance with the health metadata 137, and as described above.

Referring back to FIG. 1, the wear management module 124 may be configured to identify groups of storage sections 520 that have similar health characteristics. The groups may include a general population group (average health metrics), a low-usage group (poor health metrics), and/or a high-usage group (robust health metrics). The groups may be identified using fixed threshold values based on characteristics of the solid-state storage medium (e.g., known and/or expected error rates), testing, experience, preferences, or the like. Alternatively, or in addition, the groups may be identified by use of adaptive thresholds. In some embodiments, the wear management module 124 identifies the storage sections 520 in the bottom 10% as low-use and/or fragile and the top 10% as high-use or robust.

Figure 5A:
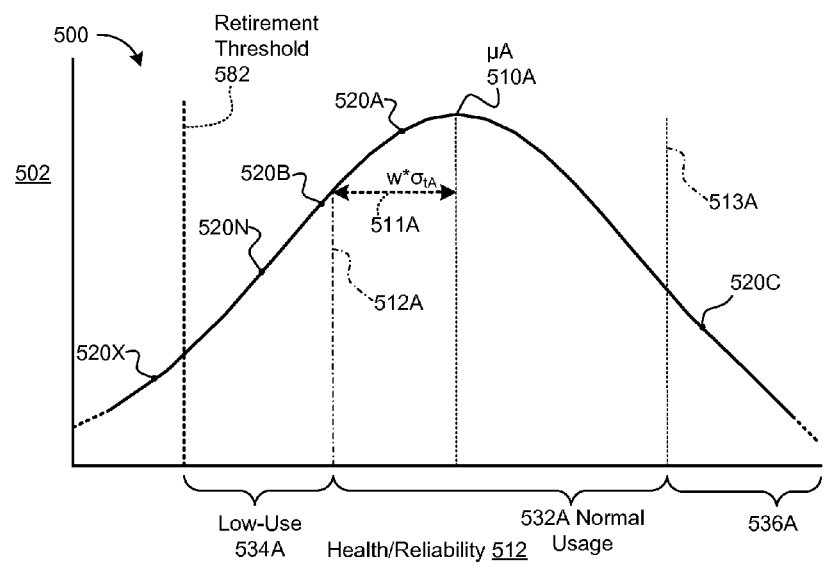
FIG. 5A depicts one embodiment of a health and/or reliability model of a plurality of storage sections.

In some embodiments, the reliability analysis module 129 determines a health model of the solid-state storage medium 111, which may comprise a statistical distribution of health and/or reliability metrics of the storage sections 520. FIG. 5A depicts one embodiment of a plot 500 of a statistical health metric distribution. The FIG. 5A embodiment depicts a Normal- or Gaussian-type distribution. However, the disclosure is not limited in this regard, and could use any suitable distribution and/or statistical model. The axis 502 may represent the distribution of storage sections 520A-N having various levels of health and/or reliability characteristics 512.

As depicted in FIG. 5A, the mean 510A of the distribution 500 may correspond to the average, overall, and/or aggregate health of the solid-state storage medium 111. Low-usage and/or fragile sections 520 may be identified as sections 520 having reliability and/or health metrics that are lower than a threshold value 512A. The threshold may be based on, inter alia, properties of the model 500, such as a weighted value of the standard deviation 511A. Storage sections 520 exhibiting lower health and/or reliability than 512A (w times the standard deviation 511A) may be identified as low-use, fragile storage sections 534A. Other sections that exhibit higher health characteristics, may be placed in a normal use 532A category. In some embodiments, the model 500 may further comprise a high-usage threshold 513 configured to identify robust storage sections for increased wear, as disclosed herein. As illustrated in FIG. 5A, sections 520B and 520N are identified as low-use 534A, storage sections 520A is identified as normal use 532A, and section 520C is identified as high-use 536A. Storage sections having reliability characteristics that do not satisfy a reliability threshold 582 may be retired (e.g., storage section 520X).

Figure 5B:
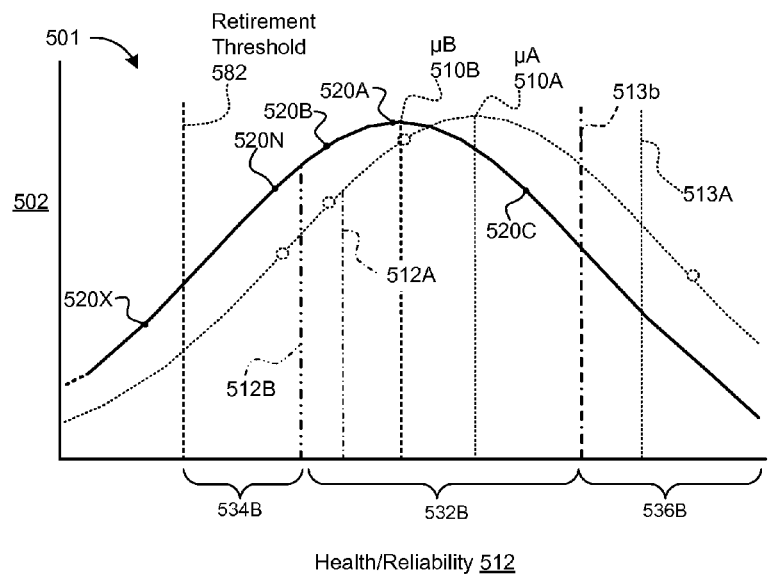
FIG. 5B depicts another embodiment of a health and/or reliability model of a plurality of storage sections.

The reliability and/or health characteristics of the solid-state storage media 110 may change over time, becoming less reliable/health. The reliability analysis module 122 may be configured to periodically or continually update reliability information in response to storage operations performed on the solid-state storage medium and/or test operations. The criteria for identifying and/or categorizing the health of storage sections 520 may change accordingly. FIG. 5B depicts a model 501 of the health of the solid-state storage medium 111 subsequent to performing a plurality of storage operations on the solid-state storage medium 111. The model 500 of FIG. 5A is included for reference. As illustrated in FIG. 5B, the overall health of the medium 111 has decreased (as indicated by the lower mean 510B as compared to 510A). The thresholds for classifying storage sections 520 as low-use, normal use, and/or high-use may be adjusted in accordance with the model 501. In the FIG. 5B example, the health of the high-use section 520C has degraded as compared to the rest of the population 520 due to, inter alia, higher wear on the section 520C imposed by the wear management module 124. The health characteristics of the low-use sections 520B and 520N may improved relative to the other sections 520 (and threshold 512B may be reduced), such that the section 520B is identified as part of the normal usage group 532B. The storage section 520N, however, may remain in the low-usage category 534B. The retirement threshold 582 may correspond that to a minimum reliability setting that may not change in response the models 500 and/or 501, and as such, the storage section 520X may remain OOS.

Figure 6A:
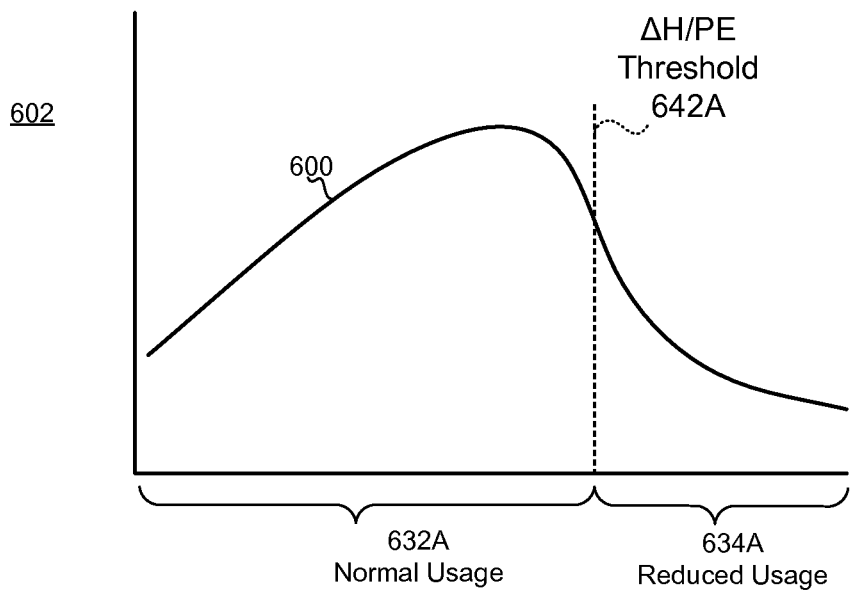
FIG. 6A depicts another embodiment of a health and/or reliability model of a plurality of storage sections.

In some embodiments, the reliability analysis module 129 may be configured to identify low-use and/or high-use sections based on the rate of change in health and/or reliability metrics. FIG. 6A depicts one embodiment a plot 600 comprising a distribution of Hr (health rate of change and/or derivative) values for storage sections 520. The axis 640 may indicate increasing rates of change to the health and/or reliability metrics of the storage sections 520 (degrading at increasing rates). A threshold 642 may correspond to a point at which the reliability analysis module 129 determines that the health and/or reliability metrics of the sections 520 in the region 634A are degrading at rate that is sufficiently higher than the rest of the normal usage population 632A to warrant reducing the wear and/or usage rate of the sections 520. The derivative approach of FIG. 9A may be more responsive to changes, such that low-wear conditions can be addressed before storage sections 520 exhibit extreme drops in health and/or reliability.

Figure 6B:
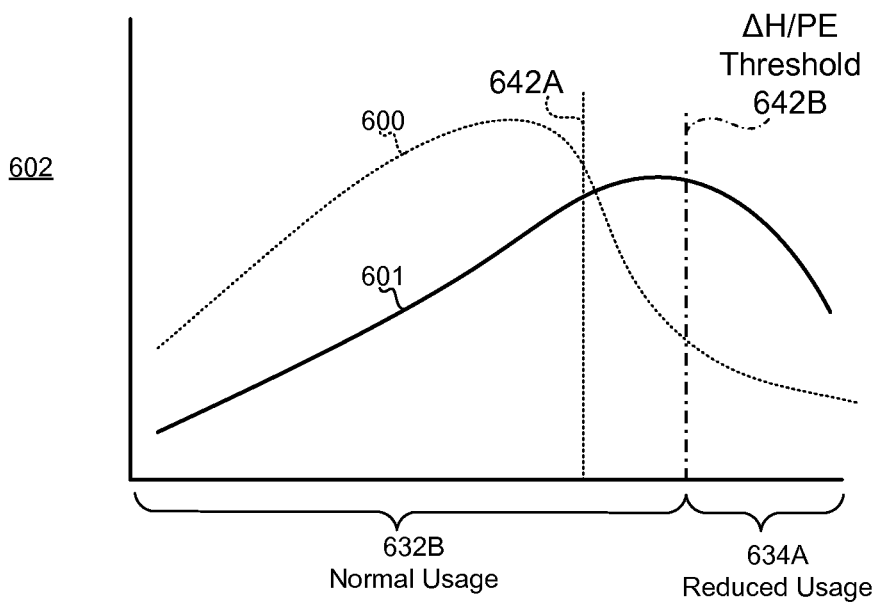
FIG. 6B depicts another embodiment of a health and/or reliability model of a plurality of storage sections.

The derivative-based model of FIG. 6A may change in response to changes within the solid-state storage media 111. In some embodiments, the health and/or reliability characteristics of the storage sections 520 may degrade non-linearly (e.g., an exponential decay, or other characteristic function). FIG. 6B depicts another embodiment of a model 601 corresponding the rage of change in storage section health metrics. As illustrated in FIG. 6B, the rate of change of the storage sections 520 has rapidly increased, which may be indicative of an overall aging of the solid-state storage medium 111. The threshold 642B may be adjusting accordingly to include storage sections 520 that are changing at a significantly higher rate 634B than the rest of the population 632B. Although not depicted in FIGS. 6A and 6B, the models 600 and 601 could further include criteria (e.g., thresholds) for identifying health, robust storage sections 520, as disclosed above. The robust storage sections 520 may include storage sections 520 having a wear rate that is lower (by a threshold value) than the other storage sections 520.

In some embodiments, the reliability analysis module 129 may be configured to combine a plurality of different models and/or selection criteria to identify low- high- and/or normal usage storage sections 520, including the models of FIGS. 5A-B and 6A-B.

Figure 7:
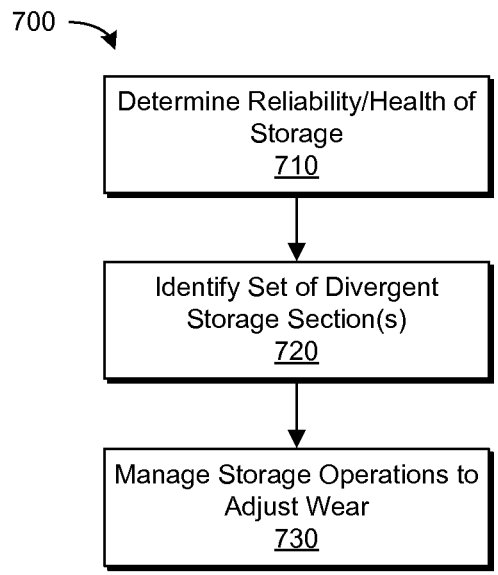
FIG. 7 is a flow diagram of one embodiment of a method for managing wear of sections of a solid-state storage medium.

FIG. 7 is a flow diagram of one embodiment of a method 700 for managing wear. The method 700, and other methods disclosed herein, may be embodied as computer-readable instruction configured for execution by a computing device. Alternatively, or in addition, one or more of the disclosed steps and/or operations may be configured for operation by one or more hardware components.

Step 710 may comprise determining the reliability and/or health of a solid-state storage medium 111, solid-state storage media 110, and/or logical storage element 515. Step 710 may comprise determining an overall reliability and/or health metric of a plurality of storage sections 520, logical storage divisions 540, erase blocks 530, and the like (referred to generally as storage sections 520). Step 710 may comprise a reliability monitoring module 122 monitoring the storage sections 520 to determine reliability and/or health characteristics of the sections 520. Monitoring may comprise accessing and/or determining performance metrics, such as erase time, program time, read time, and the like, reliability metrics, such as BER, RBER, and the like, wear levels, such as PE count, and so on. Step 710 may further comprise a weighted combination of a plurality of factors to generate one or more health and/or reliability metrics for the storage sections 710. Step 710 may further comprise combining, aggregating, and/or fusing the reliability and/or health metrics of the plurality of storage sections to determine an overall metric. In some embodiments, step 710 further comprises determining a model of the health and/or reliability of the storage sections 520, such as a statistical model, a derivative model, or the like. In some embodiments, step 710 may further comprise storing storage metadata 137 pertaining to the reliability/health metrics and/or characteristics (and/or the identified sets of storage sections 520, described below), on a non-volatile storage medium, for use following a restart operation, crash, or the like.

Step 720 may comprise identifying a set of one or more storage sections 520 having health and/or reliability metrics that diverge from others of the plurality of storage sections 520. Divergent section(s) 520 may include sections 520 having health and/or reliability metrics that differ from the overall health and/or reliability metric by more than a threshold. Alternatively, or in addition, the divergent section(s) 520 may correspond to sections 520 that having a health and/or reliability metric that is changing more or less rapidly than other sections 520. Step 720 may comprise identifying low-wear sections 520. Step 720 may further comprise identifying a general population of sections 520 and/or robust sections 520. The divergent sections 520 may be identified by comparing health and/or reliability metrics of the storage sections to the overall health and/or reliability metric, one or more threshold, or the like. In some embodiments, step 720 comprises determining a deviation and/or other statistical property to categorize one or more storage sections 520, as disclosed herein.

Step 730 may comprise managing storage operations performed on the storage sections 520 to adjust a wear and/or usage on the set of storage sections 520 identified at step 720. The wear management operations of step 730 may be configured to mitigate differences in health and/or reliability characteristics between different the plurality of storage sections 520 based on, inter alia, characteristics corresponding to the reliability of the storage sections 520, the performance of the storage sections 520, and the like. The characteristics may further include PE count and/or other wear-related factors, as disclosed above. Accordingly, the management operations of step 730 may be configured to increase the overall useful life and/or health of the storage sections 520 by distributing operations to the storage sections 520 according to health and/or reliability characteristics thereof, as opposed to PE cycles alone.

Managing storage operations may comprise reducing the wear and/or usage to the set of storage sections which may include, but is not limited to: configuring a groomer module 128 to reduce the rate at which the storage sections 520 are made available for storing data by, inter alia, relocating data from the storage sections 520 and delaying and/or deferring one or more initialization operations, such as an erasure operation and/or insertion into a pool 148 of available storage sections 520; configuring the log storage module 248 to skip, bypass and/or delay data storage to the identified sections 520; removing the one or more storage sections from the pool 148 of available storage sections 520; reordering the one or more storage sections in a queue of available storage sections 520; updating priority metadata 539 in the pool 148 to defer use of the storage section 520; placing the storage sections 520 in a low-usage queue 149; temporarily retiring the storage sections 520 by, inter alia, updating health metadata 137 to indicate that the storage sections 520 are OOS; and/or storing low-use and/or cold data on one or more of the storage sections 520.

Figure 8:
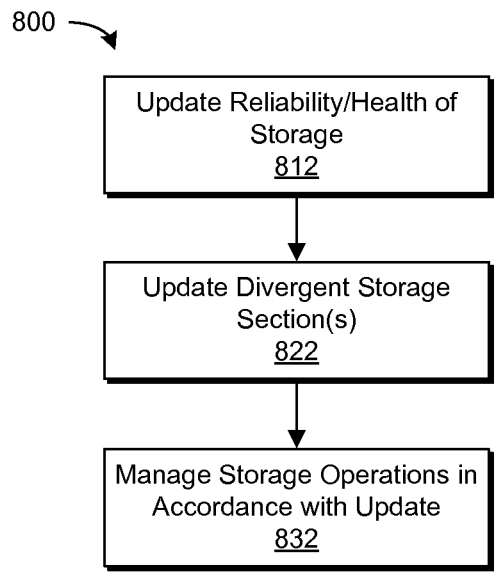
FIG. 8 is a flow diagram of another embodiment of a method for managing wear of sections of a solid-state storage medium.

FIG. 8 is a flow diagram of another embodiment of a method 800 for managing wear of a storage division. Step 812 may comprise updating a health and/or reliability metric of a plurality of solid-state storage sections 520. Step 812 may comprise determining an updated overall, aggregate, and/or combined metric, as disclosed above. Step 812 may further comprise determining an updated health and/or reliability model.

Step 822 may comprise updating the sets of divergent solid-state storage section (s) 520, as disclosed above. Step 822 may comprise evaluating the health and/or reliability characteristics of the plurality of solid-state storage sections 520 against the updated aggregate characteristics of step 812. Step 822 may further comprise reclassifying one or more of the solid-state storage sections 520 in accordance with the updates of step 812, as disclosed above (e.g., a low-use solid-state storage section 520B as a normal-use solid-state storage section 520B, as in FIG. 5B).

Step 832 may comprise managing storage operations in accordance with the updates of step 822. Step 832 may include, but is not limited to reclassifying a low-use solid-state storage section 520 as a normal-use solid-state storage section 520 by, inter alia, configuring the groomer module 128 to resume normal grooming operations on the solid-state storage section 520, placing the solid-state storage section 520 in the pool 148, including the solid-state storage section 520 in a queue, updating priority metadata 539 associated with the solid-state storage section 520, un-retiring the solid-state storage section 520 (e.g., updating health metadata to indicate that the solid-state storage section 520 is no longer retired), and so on, as disclosed above.

Figure 9:
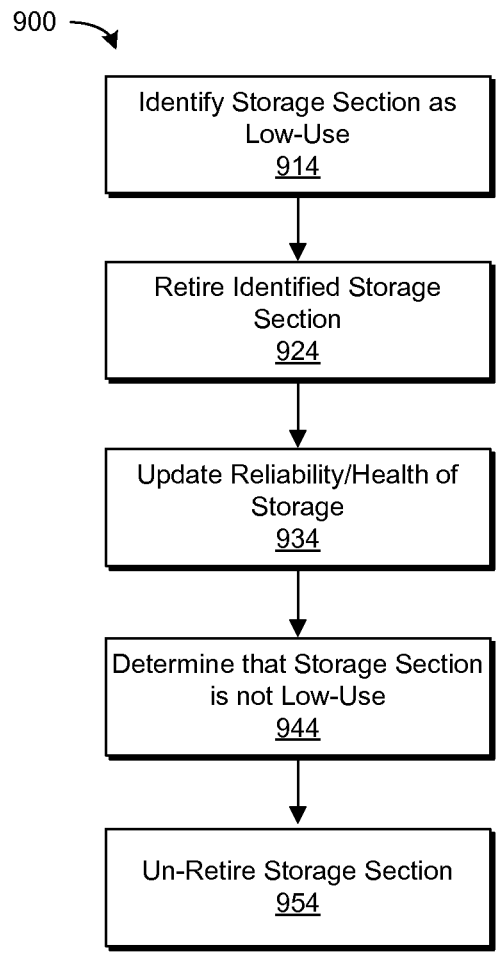
FIG. 9 is a flow diagram of another embodiment of a method for managing wear of sections of a solid-state storage medium.

FIG. 9 is a flow diagram of another embodiment of a method 900 for managing wear of storage sections 520. Step 914 may comprise identifying a storage section 520 as a low-use storage section, as disclosed herein. Step 924 may comprise configuring the OOS management module 126 to treat the storage sections 520 as a retired and/or OOS storage section 520. Step 924 may further comprise performing a plurality of storage operations on other storage sections 520 while maintaining the low-use storage section 520 as a retired/OOS storage section 520. Step 934 may comprise updating the reliability and/or health metrics of the storage sections 520, which may include determining an overall, aggregate, and/or combined metric and/or model, as disclosed herein. Step 944 may comprise determining that the storage section 520 is no longer a low-use storage section. Step 944 may comprise determining that the reliability and/or health characteristics of the other storage sections 520 have progressed to a point that the storage section 520 is no longer divergent with respect to the other storage sections 520. Step 944 may, therefore, comprise re-classifying and/or identifying the storage section as a normal-use storage section 520.

Step 954 may comprise un-retiring the storage section 520, which may comprise configuring the OOS management module 126 to use the storage section 520 to store data (as opposed to avoiding the section 520, remapping the section 520, or the like). Step 946 may comprise updating health metadata 137 to indicate that the storage section 520 is no longer OOS and/or retired. Step 954 may further comprise performing storage operations on the storage sections 520, including the un-retired storage section 520.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of medium/machine-readable medium suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the disclosure.

We claim:

1. A method, comprising:
    determining an average error rate of storage operations performed across a plurality of sections of a solid-state storage medium;
    identifying a section of the solid-state storage medium having an error rate that differs from the determined average error rate by more than a threshold; and
    managing storage operations performed on the solid-state storage medium such that a program count for the identified section diverges from a program count of other sections of the solid-state storage medium.

2. The method of claim 1, wherein managing the storage operations comprises relocating valid data from the identified section and deferring a reclamation operation on the identified section.

3. The method of claim 1, wherein managing the storage operations comprises identifying a storage request pertaining to cold data, and storing the cold data on the identified section.

4. The method of claim 1, further comprising indicating that the identified section is out-of-service.

5. The method of claim 4, further comprising indicating that the identified section is in service and available for storing data in response to determining that a differential between the error rate of the identified section and a new average error rate of the solid-state storage medium determined after performing a plurality of storage operations on the solid-state storage medium is within the threshold.

6. The method of claim 1, further comprising:
determining an updated average error rate of the solid-state storage medium subsequent to identifying the section; and
managing storage operations performed on the solid-state storage medium such that a usage rate of the identified section converges with a usage rate of the other sections of the solid-state storage medium in response to determining that the error rate of the identified section differs from the updated average error rate by less than the threshold.

7. The method of claim 1, further comprising:
recording data indicating that the identified section is a reduced wear section of the solid-state storage medium; and
accessing the recorded data to manage the storage operations performed on the solid-state storage medium.

8. The method of claim 7, further comprising recording the data on a non-volatile storage medium.

9. The method of claim 1, wherein the error rate of a section of the solid-state storage medium is based on one or more of a raw bit error rate of read operations performed on the section, a program time for writing data to the section, and an erase time of the section.

10. An apparatus, comprising:
a reliability analysis module configured to determine an aggregate bit error rate of a solid-state storage medium and to identify a storage division of the solid-state storage medium having a bit error rate that deviates from the aggregate bit error rate by more than a threshold; and
a wear management module configured to adapt storage operations performed on the solid-state storage medium to cause an erase count of the identified storage division to differ from erase counts of other storage divisions of the solid-state storage medium,
wherein each of the reliability analysis module and the wear management module comprise one or more of logic hardware and executable code, the executable code stored on a computer readable storage medium.

11. The apparatus of claim 10, further comprising a reliability monitoring module configured to determine bit error rates of storage divisions of the solid-state storage medium, wherein the storage division bit error rates are based on bit errors corresponding to operations performed on the storage divisions.

12. The apparatus of claim 10, further comprising a groomer module configured to prepare storage divisions for use by relocating valid data from the storage divisions and initializing the storage divisions, wherein the groomer module is configured to prepare the identified storage division for reuse by relocating valid data from the identified storage division and delaying initialization of the identified storage division.

13. The apparatus of claim 10, further comprising a log storage module configured to queue storage divisions for data storage operations, wherein the log storage module is configured to remove the identified storage division from the queue.

14. The apparatus of claim 13, wherein the log storage module is configured to queue the identified storage division in a reduced usage queue, and to schedule a storage operation on a storage division in the reduced usage queue in response to receiving a storage request pertaining to low-usage data.

15. The apparatus of claim 13, wherein the log storage module is configured to queue storage divisions in an ordered queue, the ordered queue comprising the identified storage division, wherein the log storage module is further configured to reorder the ordered queue such that the identified storage division is at an end of the ordered queue.

16. The apparatus of claim 10, wherein the reliability analysis module is configured to retire the identified storage division, and to remove the identified storage division from retirement in response to determining that a difference between the health metric of the identified storage division and an updated aggregate health metric corresponding to respective health metrics of the storage divisions of the solid-state storage medium is less than the threshold.

17. A system, comprising:
means for identifying a first set of a plurality of solid-state storage sections having storage error rates that differ from storage error rates of a second set of the plurality of solid-state storage sections by more than a threshold;
means for receiving requests to perform storage operations on the solid-state storage sections; and
means for varying usage of the plurality of solid-state storage sections in servicing the requests to modify usage of the first set of solid-state storage sections such that erase counts on the solid-state storage sections of the first set differ as compared to erase counts of solid-state storage sections in the second set.

18. The system of claim 17, further comprising means for determining storage error rates of the solid-state storage sections comprising means for monitoring one or more of bit error rates for read operations performed on the respective solid-state storage sections, bit error rates for program operations performed on the respective solid-state storage sections, program times of the respective solid-state storage sections, and erase times of the respective solid-state storage sections.

19. The system of claim 18, further comprising:
means for determining updated storage error rates of solid-state storage sections of the second set of storage sections; and
means for selecting a storage section for removal from the first set and inclusion in the second set in response to determining that a storage error rate of the selected storage section is within a deviation threshold of the updated storage error rates of the solid-state storage sections in the second set.

20. The system of claim 17, further comprising means for grooming solid-state storage sections for reuse comprising means for delaying reuse of solid-state storage sections in the first set.

21. The system of claim 17, further comprising means for queuing storage operations on the solid-state storage sections configured to prevent storage operations from being queued to the solid-state storage sections in the first set.

* * * * *